(12) United States Patent
Azarnaminy et al.

(10) Patent No.: US 10,256,788 B2
(45) Date of Patent: Apr. 9, 2019

(54) ACOUSTIC RESONATOR INCLUDING EXTENDED CAVITY

(71) Applicant: Avago Technologies General IP (Singapore) Pte. Ltd., Singapore (SG)

(72) Inventors: Siamak Fouladi Azarnaminy, San Jose, CA (US); David A. Feld, Newark, CA (US); Qiang Zou, Fort Collins, CO (US); Andrew Barfknecht, Menlo Park, CA (US); Mohamed Abd Allah, Sunnyvale, CA (US); Jing Wu, San Jose, CA (US); Zongliang Cao, San Jose, CA (US); Guiti Zolfagharkhani, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/476,797

(22) Filed: Mar. 31, 2017

(65) Prior Publication Data

US 2018/0287584 A1    Oct. 4, 2018

(51) Int. Cl.
| | | |
|---|---|---|
| *H03H 9/17* | (2006.01) | |
| *H03H 9/54* | (2006.01) | |
| *H01L 41/047* | (2006.01) | |
| *H01L 41/08* | (2006.01) | |

(52) U.S. Cl.
CPC .......... *H03H 9/171* (2013.01); *H01L 41/047* (2013.01); *H01L 41/0825* (2013.01); *H03H 9/54* (2013.01)

(58) Field of Classification Search
CPC ....... H03H 9/171; H03H 9/177; H01L 41/047

USPC .................................. 333/187; 310/320, 324
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,107,721 A | 8/2000 | Lakin |
| 6,507,983 B1 | 1/2003 | Ruby et al. |
| 6,828,713 B2 | 12/2004 | Bradley et al. |
| 6,946,928 B2 | 9/2005 | Larson, III et al. |
| 7,280,007 B2 | 10/2007 | Feng et al. |
| 7,321,183 B2 * | 1/2008 | Ebuchi ..................... H03H 3/02 310/324 |
| 7,345,410 B2 | 3/2008 | Grannen et al. |
| 7,358,831 B2 | 4/2008 | Larson, III et al. |
| 7,369,013 B2 | 5/2008 | Fazzio et al. |
| 7,388,454 B2 | 6/2008 | Ruby et al. |

(Continued)

*Primary Examiner* — Dean O Takaoka

(57) ABSTRACT

A BAW resonator includes a nonlinear substrate defining a cavity, and an acoustic stack over the cavity, including a bottom electrode, a piezoelectric layer, and a top electrode, where an active region of the acoustic stack includes overlapping portions of the cavity, the bottom electrode, the piezoelectric layer and the top electrode. The BAW resonator further includes a connecting strip extending from a portion of the top electrode for providing electrical excitation of the acoustic stack, where an E-field generated in the BAW resonator begins at the top electrode and terminates at the bottom electrode in response to the electrical excitation. The cavity includes an inner portion in the active region and an extended portion extending from an outer perimeter of the active region underneath the connecting strip. A length of the extended portion are sufficient to substantially prevent portions of the E-field from passing through the substrate.

30 Claims, 12 Drawing Sheets

(56) References Cited

U.S. PATENT DOCUMENTS

| | | | |
|---|---|---|---|
| 7,561,009 B2 | 7/2009 | Larson, III et al. | |
| 7,629,865 B2 | 12/2009 | Ruby | |
| 7,714,684 B2 | 5/2010 | Ruby et al. | |
| 7,728,485 B2 | 6/2010 | Handtmann et al. | |
| 7,791,434 B2 | 9/2010 | Fazzio et al. | |
| 7,884,527 B2 * | 2/2011 | Tsutsumi | H03H 9/02118 310/320 |
| 7,978,025 B2 * | 7/2011 | Yokoyama | H03H 3/04 310/322 |
| 8,080,854 B2 * | 12/2011 | Fazzio | H03H 3/02 257/245 |
| 8,125,123 B2 * | 2/2012 | Nishihara | H03H 9/02015 310/234 |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,350,445 B1 * | 1/2013 | Shirakawa | H03H 3/02 310/320 |
| 8,436,516 B2 | 5/2013 | Ruby et al. | |
| 8,653,908 B2 * | 2/2014 | Hara | H03H 3/02 310/320 |
| 8,854,156 B2 * | 10/2014 | Iwashita | H03H 3/02 310/312 |
| 8,902,023 B2 | 12/2014 | Choy et al. | |
| 9,197,185 B2 | 11/2015 | Zou et al. | |
| 2007/0205850 A1 | 9/2007 | Jamneala et al. | |
| 2010/0327697 A1 | 12/2010 | Choy et al. | |
| 2010/0327994 A1 | 12/2010 | Choy et al. | |
| 2011/0180391 A1 | 7/2011 | Larson, III et al. | |
| 2011/0266925 A1 | 11/2011 | Ruby et al. | |
| 2012/0218060 A1 | 4/2012 | Burak et al. | |
| 2012/0177816 A1 | 7/2012 | Larson, III et al. | |
| 2012/0218057 A1 | 8/2012 | Burak et al. | |
| 2012/0326807 A1 | 12/2012 | Choy et al. | |
| 2013/0015747 A1 | 1/2013 | Ruby et al. | |
| 2013/0049545 A1 | 2/2013 | Zou et al. | |
| 2014/0118090 A1 | 5/2014 | Grannen et al. | |
| 2014/0132117 A1 | 5/2014 | Larson, III | |
| 2014/0175950 A1 | 6/2014 | Zou et al. | |
| 2014/0176261 A1 * | 6/2014 | Burak | H03H 9/132 333/187 |
| 2014/0225682 A1 | 8/2014 | Burak et al. | |
| 2014/0292150 A1 | 10/2014 | Zou et al. | |
| 2014/0354109 A1 | 12/2014 | Grannen et al. | |
| 2015/0207489 A1 * | 7/2015 | Bi | H03H 9/132 310/324 |
| 2015/0244347 A1 | 8/2015 | Feng et al. | |
| 2015/0280687 A1 | 10/2015 | Burak et al. | |
| 2015/0349747 A1 * | 12/2015 | Burak | H03H 9/173 333/187 |

* cited by examiner

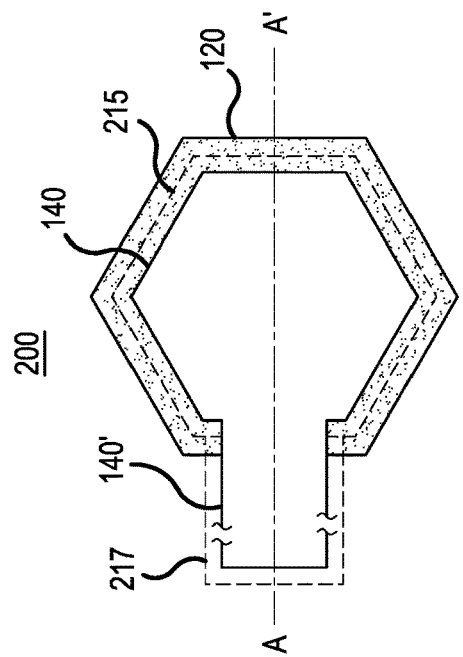
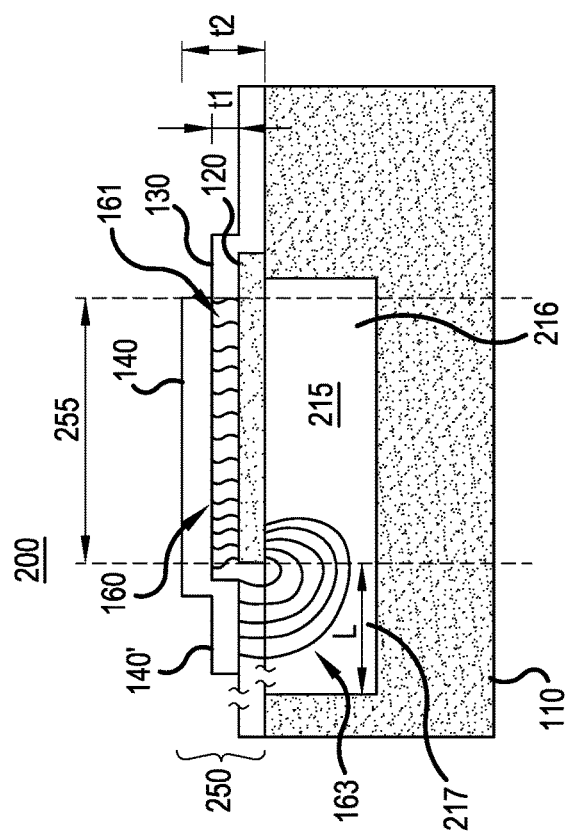
FIG.2B
FIG.2A

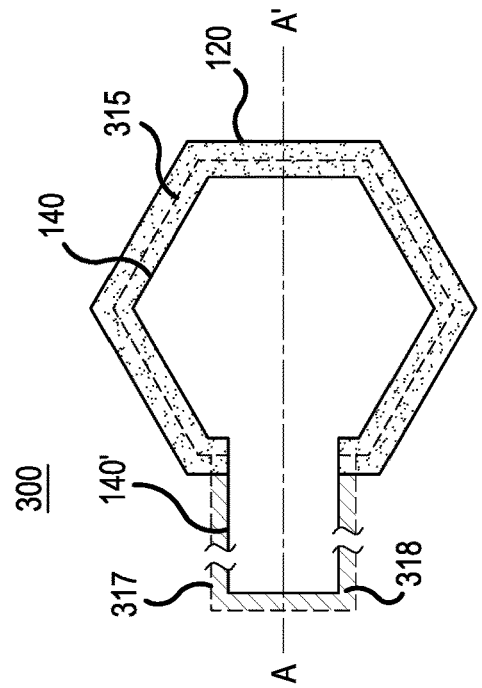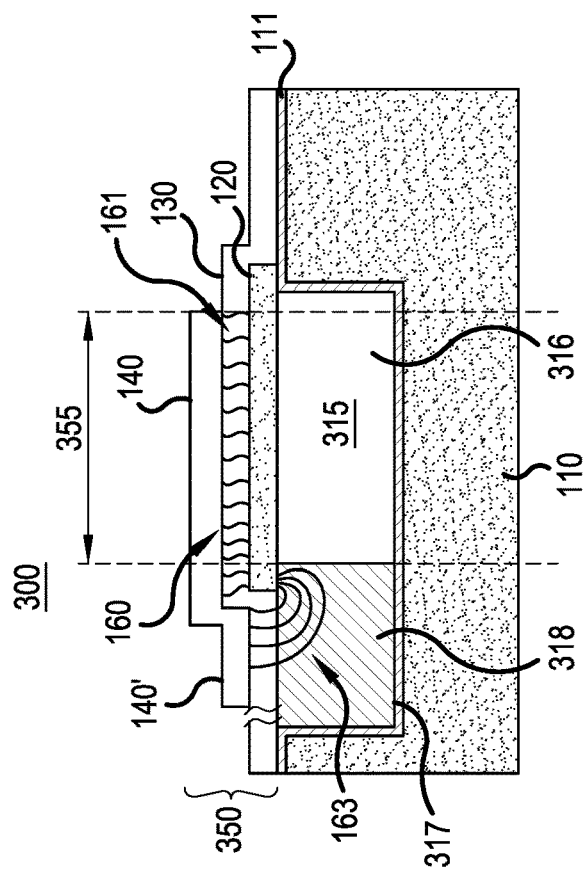
FIG. 3B
FIG. 3A

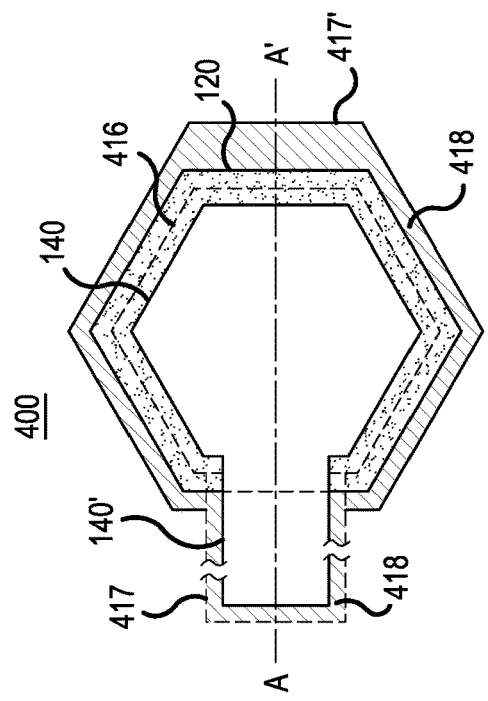
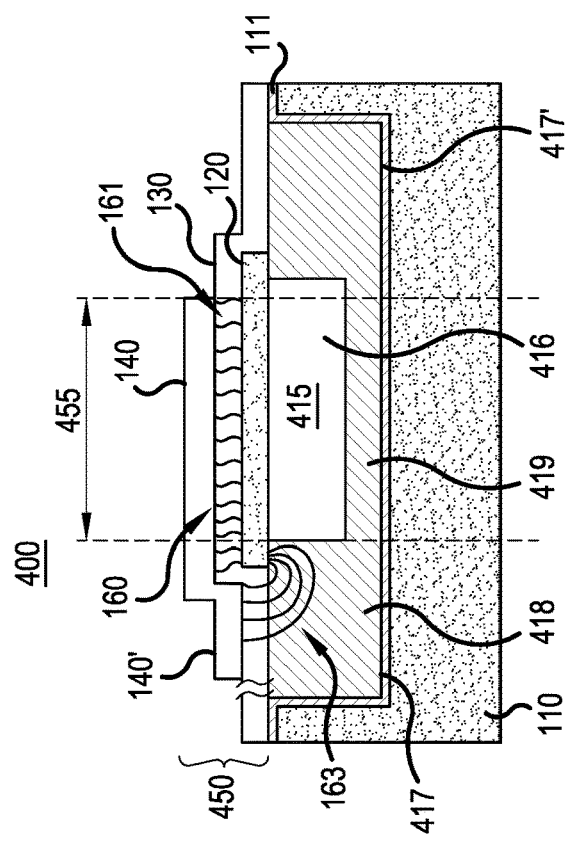

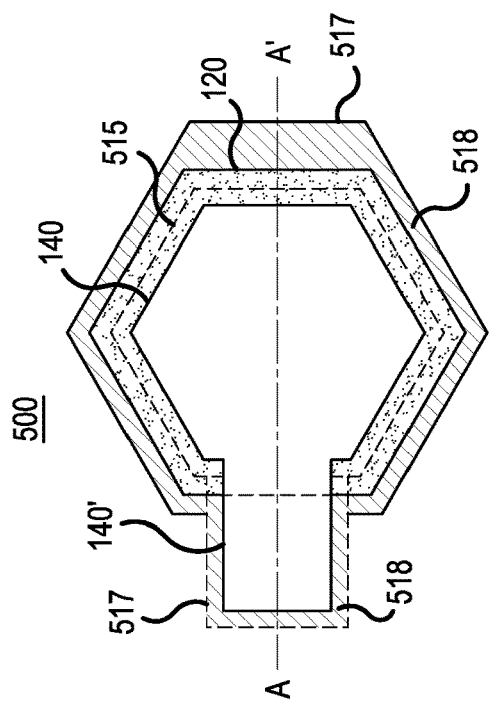
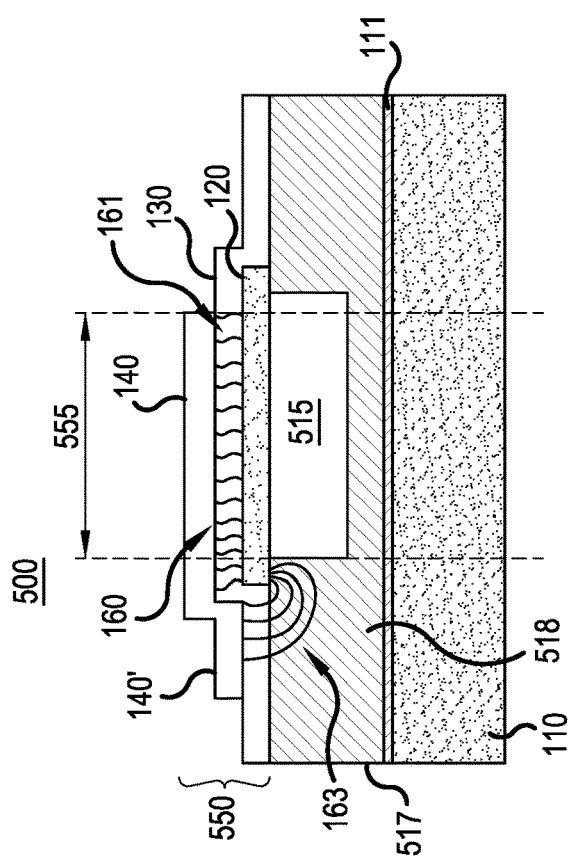
FIG.5B
FIG.5A

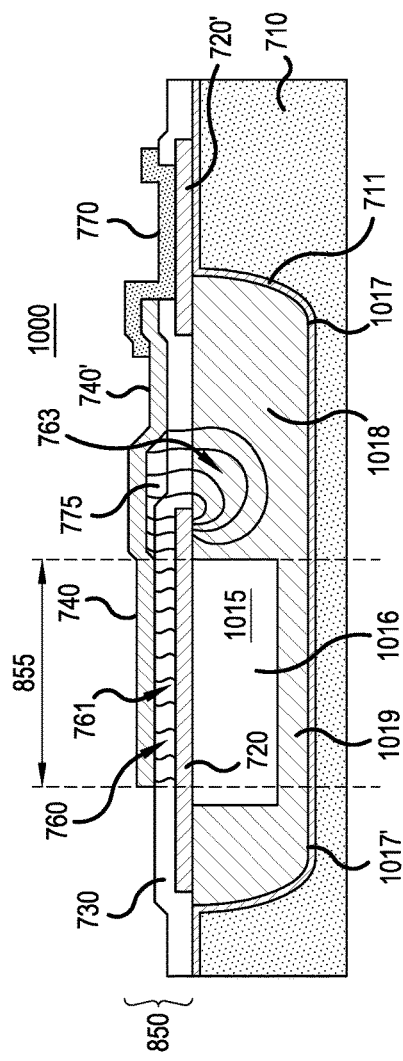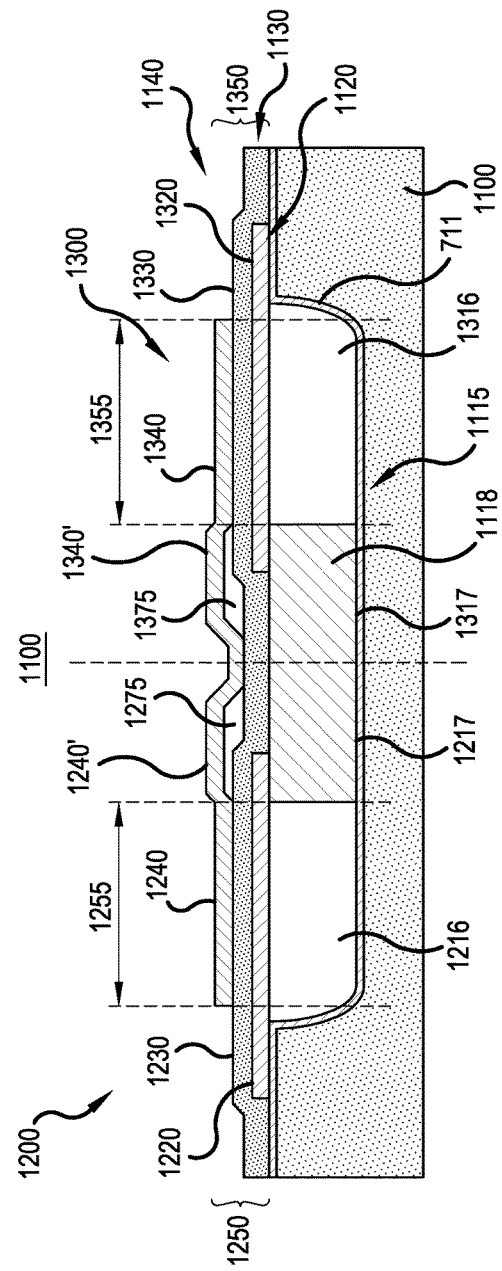

ACOUSTIC RESONATOR INCLUDING EXTENDED CAVITY

BACKGROUND

Acoustic transducers generally convert electrical signals to acoustic signals (sound waves) and convert received acoustic waves to electrical signals via inverse and direct piezoelectric effect. There are a number of types of acoustic transducers including acoustic resonators, such as bulk acoustic wave (BAW) resonators and surface acoustic wave (SAW) resonators. BAW resonators, in particular, include thin film bulk acoustic resonators (FBARs), which generally have acoustic stacks formed over a substrate cavity, and solidly mounted resonators (SMRs), which generally have acoustic stacks formed over an acoustic mirror (e.g., a distributed Bragg reflector (DBR)). BAW resonators may be used for electrical filters and voltage transformers, for example, in a wide variety of electronic applications, such as cellular telephones, personal digital assistants (PDAs), electronic gaming devices, laptop computers and other portable communications devices.

A BAW resonator has an acoustic stack comprising a layer of piezoelectric material between two conductive plates (e.g., top and bottom electrodes). In response to electrical excitation, the acoustic stack vibrates and an electric field (E-field) is produced within the BAW resonator, which begins at the top electrode and terminates at the bottom electrode. The E-field distribution is dependent on the frequency of the electrical excitation (and the resonant frequency of the BAW resonator). For example, if the electrical excitation is applied at the resonant frequency of the BAW resonator, the integral of the E-field across the top and bottom electrodes will be approximately zero, and therefore, there will be no significant voltage drop from the top to the bottom electrode. Since there is little or no voltage drop across the top and bottom electrodes, there will be little to no E-field generated outside the piezoelectric layer (i.e., little to no parasitic E-field, discussed below). However, if the electrical excitation is applied near the anti-resonant frequency, the integral of the E-field across the electrodes will be significant, producing a large voltage drop across the top and bottom electrodes, and thus generating a significant E-field outside of the piezoelectric layer (i.e., a significant parasitic E-field), as would be apparent to one skilled in the art.

BAW resonators exhibit an electrical response that is primarily linear. That is, when they are excited by a stimulus comprising one or more tones, the BAW resonators produce an electrical (and a mechanical) response comprising primarily the same set of frequencies at which the stimulus was applied. However, as explained further, below, the BAW resonators also exhibit a weakly nonlinear response comprising a weak generation of tones at harmonic frequencies of the applied tones (harmonic generation) and a weak generation of tones at sums and differences of the harmonic frequencies of the applied tones (intermodulation distortion). A portion of the E-field generated outside an active area of the acoustic stack of the BAW resonator is referred to as parasitic E-field. When the electrical excitation is a single tone, it induces a parasitic E-field which passes through a material of the BAW resonator having a weak electric field non-linearity ("nonlinear material"), such as the substrate (e.g., typically formed of silicon (Si)), an electric response which is typically orders of magnitude weaker than the applied tone, is produced at harmonic frequencies. Notably, the density of the electric lines of force—indicative of the strength of the E-field in the nonlinear material (discussed below)—depends on the frequency and signal power of the tone. Typically, a reduction in the strength of the E-field results in a reduction in this nonlinear electric response. When the electrical excitation is a superposition of two or more tones, each at a different frequency, it induces a superposition of E-field distributions in the nonlinear material in response to each of the tones where the E-fields intermodulate or "mix" with one another producing an electric response, which is typically orders of magnitude weaker than any of the applied tones, at sum and difference frequencies of harmonics of the applied tones ("intermodulation distortion (IMD) frequencies"). Notably, the density of the electric lines of force for each tone—indicative of the strength of the E-fields corresponding to each tone in the nonlinear material (discussed below)—depend on the frequency and the signal power of each of each tone. Typically, a reduction in the strength of the E-field in any of the tones, results in a reduction in this nonlinear electric response.

The aforementioned electric responses produced at the harmonic and intermodulation frequencies are "nonlinear responses" which induce "nonlinear currents" that flow through the nonlinear material and/or along the surface of the nonlinear material (e.g., at an interface of the substrate and the acoustic stack of the BAW resonator) and into the electrical terminals of the BAW resonator large enough to interfere with normal operation of the device incorporating the BAW resonator ("interfering nonlinear currents"). For example, when the BAW resonator is part of a radio frequency (RF) acoustic filter, the parasitic E-field(s) result in unwanted nonlinear currents being generated in the RF acoustic filter. In other words, unwanted harmonics and/or mixing products (from tones at two or more frequencies), such as second and third order harmonics and/or IMDs, may result from parasitic E-fields in the nonlinear material.

As described above, in order to reduce the nonlinear response due to the presence of the electric lines of force, there is a need for acoustic resonators configured to minimize or eliminate E-fields from passing through nonlinear materials within the devices, such that nonlinear responses from the acoustic resonator devices and/or from devices (e.g., acoustic filters) that include such acoustic resonator devices are minimized or eliminated. Also, there is a need for minimizing or eliminating the E-fields from passing through such nonlinear materials without negatively affecting other performance characteristics, such as heat transfer and/or structural integrity, of the acoustic resonators and corresponding devices.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 2A and 2B are simplified cross-sectional and top plan views of a BAW resonator including an extended cavity, according to a representative embodiment.

FIGS. 3A and 3B are simplified cross-sectional and top plan views of a BAW resonator including an extended cavity, according to a representative embodiment.

FIGS. 4A and 4B are simplified cross-sectional and top plan views of a BAW resonator including an extended cavity, according to a representative embodiment.

FIGS. 5A and 5B are simplified cross-sectional and top plan views of a BAW resonator including a cavity in an interposer layer, according to a representative embodiment.

FIG. 10 is a simplified cross-sectional view of a BAW resonator including an extended cavity and an air-bridge, according to a representative embodiment.

FIG. 11 is a simplified cross-sectional view of two BAW resonators with a shared top electrode connection, including a common cavity and air-bridges, according to a representative embodiment.

DETAILED DESCRIPTION

Figure 1B:
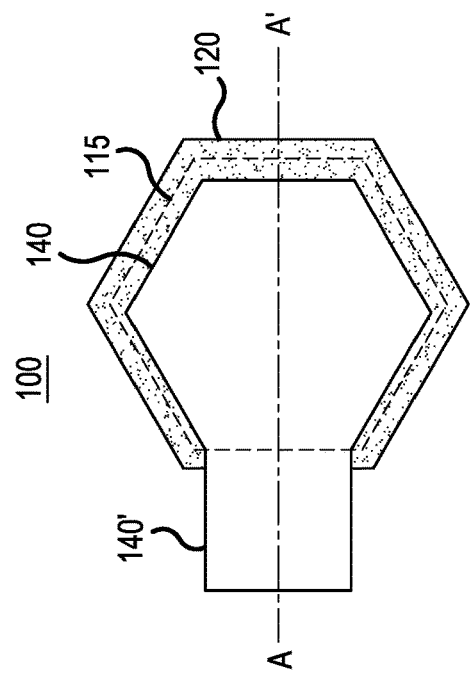
FIGS. 1A and 1B are simplified cross-sectional and top plan views of a conventional BAW resonator.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684, and 8,436,516 to Ruby et al.; U.S. Pat. Nos. 7,369,013, 7,791,434 8,188,810, and 8,230,562 to Fazzio, et al.; U.S. Pat. No. 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009 and 7,358,831 to Larson, III et al.; U.S. Pat. No. 9,197,185 to Zou, et al., U.S. Patent Application Publication No. 2012/0326807 to Choy, et al.; U.S. Patent Application Publications Nos. 2011/0180391 and 2012/0177816 to Larson III, et al.; U.S. Patent Application Publication No. 2007/0205850 to Jamneala et al.; U.S. Patent Application Publication No. 2011/0266925 to Ruby, et al.; U.S. Patent Application Publication No, 2013/0015747 to Ruby, et al.; U.S. Patent Application Publication No. 2013/0049545 to Zou, et al.; U.S. Patent Application Publication No. 2014/0225682 to Burak, et al.; U.S. Patent Publication No. 2014/0132117 to John L. Larson III; U.S. Patent Publication Nos.: 2014/0118090 and 2014/0354109 John L. Larson III, et al.; U.S. Patent Application Publication Nos. 2014/0292150, and 2014/0175950 to Zou, et al.; and U.S. Patent Application Publication No. 2015/0244347 to Feng, et al. The entire contents of each of the patents, and patent application publications listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

Figure 1A:
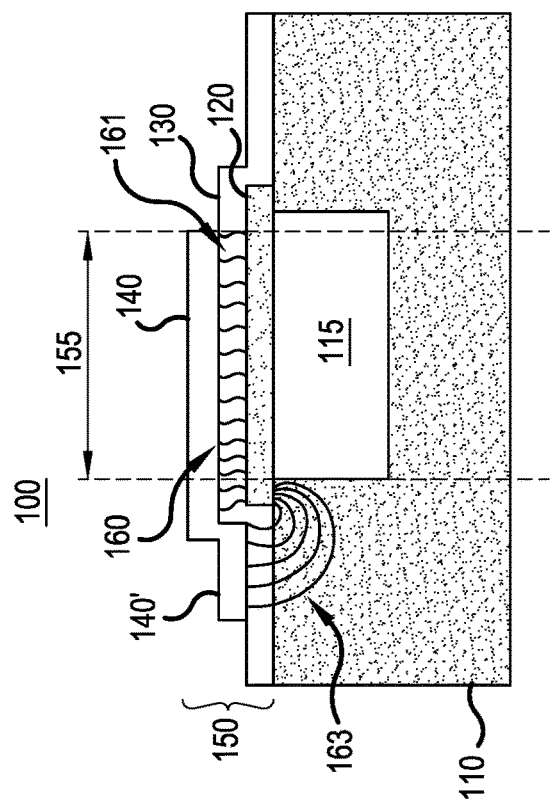

FIGS. 1A and 1B are simplified cross-sectional and top plan views of a conventional BAW resonator, where FIG. 1A is the cross-section taken along line A-A' of FIG. 1B.

Referring to FIG. 1A, BAW resonator 100 is a thin film bulk acoustic resonator (FBAR). The BAW resonator 100 includes a substrate 110 and a cavity 115 formed as an acoustic reflector in a top surface of the substrate 110. A first (bottom) electrode 120 is disposed over the substrate 110 and the cavity 115, a piezoelectric layer 130 is disposed over the bottom electrode 120, and a second (top) electrode 140 is disposed over the piezoelectric layer 130, forming an acoustic stack 150. An active region 155 of the acoustic stack 150 includes overlapping portions of the cavity 115, the bottom electrode 120, the piezoelectric layer 130 and the top electrode 140. An outer perimeter of the active region 155 is indicated by a pair of (vertical) dashed lines. The BAW resonator 100 also includes a connecting strip 140' extending from a portion of the top electrode 140, as discussed in more detail below. A passivation layer (not shown) may be formed over the top electrode 140 and, in various configurations, over all or a portion of the connecting strip 140' as well. The passivation layer generally insulates the acoustic stack from the environment, including protection from moisture, corrosives, contaminants, debris and the like.

Referring to FIG. 1B, the top plan view of the BAW resonator 100 shows the top electrode 140 stacked over the piezoelectric layer (not shown for the sake of convenience), the bottom electrode 120 and the cavity 115. The outer edges of the cavity 115 are dashed lines, indicating that the cavity 115 is located beneath at least one of the top electrode 140, the bottom electrode 120 and the piezoelectric layer 130, and therefore would not be otherwise visible from the perspective of FIG. 1B. The substrate 110 is also not shown in FIG. 1B for the sake of convenience.

As mentioned above, the BAW resonator 100 also includes the connecting strip 140' extending from a portion of the top electrode 140. The connecting strip 140' provides electrical excitation of the acoustic stack 150 through the top electrode 140. The electrical excitation is provided through electrical contact with a component (not shown), such as a contact pad or a via, configured to pass electrical signals.

An electric field (E-field) 160 is generated in the BAW resonator 100 in response to the electrical excitation, indicated by electric lines of force ("E-field lines"), mentioned above, beginning at the top electrode 140 and terminating at the bottom electrode 120. When the electrical excitation is at or near the resonant frequency of the BAW resonator 100, the BAW resonator 100 exhibits acoustic resonance (vibration). A portion of the E-field 160 generated from the top electrode 140 through the piezoelectric layer 130 to the bottom electrode within the active region 155 of the acoustic stack 150 may be referred to as an operational E-field 161. As shown in FIG. 1A, the operational E-field 161 is within the active region 155. For purposes of illustration, the piezoelectric layer 130 is formed of a substantially linear material (e.g., AlN) that exhibits a primarily linear electrical response to the operational E-field 161, but which also exhibits a nonlinear electrical response when one or more tones are incident upon it.

Another portion of the E-field 160 beginning at the top electrode 140, passing outside the active region 155 and terminating at the bottom electrode 120 may be referred to as a parasitic E-field 163, and is generated whenever the electrical excitation is not specifically applied at the resonant frequency. As shown in FIG. 1A, the parasitic E-field 163 is outside the active region 155. For example, as shown in FIG. 1A, at least a portion of the parasitic E-field 163 passes through the substrate 110 (and possibly through a portion of the cavity 115) to terminate at the bottom electrode 120 (on its bottom surface). For simplicity and clarity, not all of parasitic E-field 163 is shown in FIG. 1A. Also, for purposes of illustration, the substrate 110 is formed of a nonlinear material (e.g., Si). The use of a nonlinear material based substrate has certain drawbacks. Since an acoustic filter, for example, may be comprised of electrically connected BAW resonators (e.g., FBARs) that reside on the nonlinear material based substrate, when (microwave) RF signals at different frequencies are incident upon the acoustic filter, some of the signal power is radiated into the substrate on which the resonators reside. Because the substrate behaves nonlinearly, these signals will be "mixed" within the volume of the substrate, resulting in a nonlinear response of the BAW resonator 100 to the parasitic E-field 163. As discussed above, the nonlinear response results in interfering nonlinear currents being generated and flowing through terminals of the BAW resonator 100. Therefore, when the BAW resonator 100 is part of an RF acoustic filter, for example, the parasitic E-field 163 results in unwanted interfering nonlinear currents generated in the RF acoustic filter. The nonlinear response to the parasitic E-field is discussed in more detail with reference to FIG. 7, below.

Notably, the parasitic E-field 163 surrounding the BAW resonator 100 that enters the substrate 110 has the highest magnitude by the connecting strip 140' (i.e., the connect edge of the BAW resonator 100). Nowhere else in the BAW resonator 100 is the parasitic E-field 163 as high. For example, the peak magnitude of the parasitic E-field 163 on the surface of the (Si) substrate 110 directly below the connect edge may be as much as ten times higher than anywhere else in the substrate 110.

For instance, two distinctly separate pieces of the bottom electrode 120 which reside on the (Si) substrate 110 may be separated laterally by a minimum metal distance of about ten microns, for example. However, the closest vertical spacing (i.e., in the direction of the stacked layers of the acoustic stack 150) in a BAW resonator between two metal layers is between the top and bottom electrodes 140 and 120, which are typically spaced apart by about one micron. It is this spacing between the top and bottom electrodes 140 and 120 comprising the acoustic stack 150 which is typically the smallest compared with any other portion of the circuit. The strongest E-fields in a circuit comprising BAW resonators will typically reside in the vicinity of where any two distinct metal electrodes are closest to one another, such as across the top and bottom metal electrodes comprising the BAW resonators, but also, in the vicinity of and underneath the respective connect edges of the BAW resonators. A connect edge of a BAW resonator is an end metal portion (edge) of a metal layer, typically the top electrode (e.g., top electrode 140), connected to an outside circuit to receive electrical excitation, which results in generation of the E-field (e.g., E-field 160).

More particularly, the bottom electrode 120 terminates at the connect edge. Notably, due to how the bottom electrode 120 is defined by a process etch, the termination at the connect edge can, in practice, substantially come to a point (and does not terminate at a 90 degree angle, as shown in FIG. 1A, for example). As such, the highest E-fields in the region of the connect edge will be generated within tens of Angstroms of the point termination. That is, the E-field in the vicinity of the connect edge will be highest in a distance comparable with the radius of curvature of the point. Although the very highest of the undesirable and/or parasitic E-fields will be present at the point of the connect edge of the bottom electrode 120, high parasitic E-fields will be present in the entire vicinity of and underneath the connect edge.

FIGS. 2A and 2B are simplified cross-sectional and top plan views of a BAW resonator including an extended cavity, according to a representative embodiment, where FIG. 2A is the cross-section taken along line A-A' of FIG. 2B.

Referring to FIG. 2A, BAW resonator 200 is an FBAR, and includes the substrate 110 with a cavity 215 formed in a top surface of the substrate 110. Like the BAW resonator 100, discussed above, the BAW resonator 200 includes bottom electrode 120 is disposed over the substrate 110 and the cavity 215, piezoelectric layer 130 disposed over the bottom electrode 120, and top electrode 140 is disposed over the piezoelectric layer 130, forming an acoustic stack 250. An active region 255 of the acoustic stack 250 includes overlapping portions of the cavity 215, the bottom electrode 120, the piezoelectric layer 130 and the top electrode 140. An outer perimeter of the active region 255 is indicated by a pair of (vertical) dashed lines. The active region 255 of the acoustic stack 250 comprises substantially flat portions of the top electrode 140 and bottom electrode 120. As explained with reference to FIG. 1A, the E-field 160 begins at the top electrode 140 and terminates at the bottom electrode 120. The operational E-field 161 is disposed within the active region 255 in which portion of the top electrode 140 and bottom electrode 120 are substantially flat. The parasitic E-field 163 is a portion of the E-field 160 which is disposed outside of the active region 255. For example, as shown in FIG. 2A, a first portion of the parasitic E-field 163 begins at portions of the top electrode 140 that include the connecting strip 140', pass outside the active region 255 and terminates on the bottom surface at an end region of the bottom electrode 120. A second portion of the parasitic E-field (not shown) begins at another end of the top electrode 140 and ends at portions of the bottom electrode 120 that is substantially flat. The second portion of the parasitic E-field terminates on the top surface of the bottom electrode 120 (which typically extends beyond the top electrode), and as such the E-field lines do not extend into the nonlinear substrate and can therefore omitted from discussion. The BAW resonator 200 also includes a connecting strip 140' extending from a portion of the top electrode 140. A passivation layer (not shown) may be formed over the top electrode 140 and, in various configurations, over all or a portion of the connecting strip 140' as well. It is understood that a passivation layer may be formed over the top electrode 140 and all or a portion of the connecting strip 140' in each of the embodiments discussed herein, and therefore will not be repeated.

The connecting strip 140' may be integrally formed with the top electrode 140, in which case the connecting strip 140' and the top electrode 140 collectively form a top electrode layer and the connecting strip 140' may be considered to be the portion of the top electrode layer extending beyond the acoustic stack 250. Alternatively, the connecting strip 140' may be a separate component connected to or otherwise in electrical contact with the top electrode 140.

The substrate 110 may be formed of various materials compatible with semiconductor processes, such as silicon (Si), gallium arsenide (GaAs), indium phosphide (InP), or the like. Various illustrative fabrication techniques for forming an air cavity in a substrate are described by Grannen et al., U.S. Pat. No. 7,345,410 (issued Mar. 18, 2008), which is hereby incorporated by reference in its entirety. The bottom and top electrodes 120 and 140 are formed of electrically conductive material(s), such as molybdenum (Mo) or tungsten (W), and the passivation layer may be formed of a passivation material, such as silicon dioxide ($SiO_2$) or silicon nitride ($Si_3N_4$), for example, although other materials compatible for use with BAW resonator electrodes and passivation may be incorporated, without departing from the scope of the present teachings. Also, in the depicted embodiment, the piezoelectric layer 130 may be formed of aluminum nitride (AlN), lead zirconate titanate (PZT) or zinc oxide (ZnO), for example. For improved performance, the material forming the piezoelectric layer 130 should have high linearity.

In the depicted embodiment, the cavity 215 includes an inner portion 216 within the active region 255 of the acoustic stack 250, and an extended portion 217 extending from an outer perimeter of the active region 255 underneath the connecting strip 140'. A length of the extended portion 217 of the cavity 215 is sufficiently long and a depth of the extended portion 217 is sufficiently deep to substantially prevent the parasitic E-field 163 from passing through the substrate 110, as shown. In other words, a negligible amount of the parasitic E-field 163 passes through in the substrate 110, such that a nonlinear response is improved (i.e., making the response more linear) by the substrate 110 and electrical loss generated in the substrate 110 is reduced. A negligible amount of the parasitic E-field 163 is considered to be none or a portion so small that the nonlinear response by the substrate 110 does not negatively influence operation of any device (e.g., an RF acoustic filter) in which the BAW resonator 200 is incorporated. Stated differently, the nonlinear response is improved by an amount sufficient to reduce or minimize formation of harmonics and/or intermodulation distortions (IMDs) such that the substrate 110 is no longer a factor in determining the nonlinear performance of the BAW resonator 200 and/or of the device incorporating the BAW resonator 200. This improvement of the nonlinear response applies to the parasitic E-fields discussed with respect to each of the various embodiments disclosed herein.

By extending the cavity 215 underneath the connecting strip 140', nonlinear currents induced by weaker E-fields than those that are shown in FIG. 2A are also eliminated. These weaker E-fields have corresponding electric lines of force beginning at the top electrode 140 and terminating at bottom electrodes in other parts of the BAW circuit (not shown in FIG. 2A, because they are either out of the plane of FIG. 2A or are on the side of the connect edge opposite to where the acoustic stack is shown in FIG. 2A).

As mentioned above, the bottom electrode 120 terminates at the connect edge (which may or may not substantially come to a point. The highest E-fields in the region of the connect edge will be generated within tens of Angstroms of the connect edge. By placing a gap (the extended portion 217) directly below the connect edge, including the entire connect edge region, the high E-field region will not be able to impinge on the substrate 110 in the vicinity of the connect edge of the bottom electrode 120, and thus will not be able to induce nonlinear currents and resistive losses to flow in that portion of the substrate 110.

When one skilled in the art analyzes impact of E-field of two conductors, lines of electric force will be drawn between the two conductors as illustrated by lines corresponding to the operational E-field 161 and the parasitic E-field 163 in FIG. 2A. When the E-field is weak, no lines will be drawn. If a simulation tool were used, E-field that is strong enough to impose material changes would be marked with certain colors for consideration and E-field that is too weak to render material changes would not be considered. By way of an example, the length of the extended portion 217 of the cavity 215 is considered sufficiently long and/or the depth of the extended portion 217 is considered sufficiently deep when the lines of electric force do not pass through the substrate 110. Similarly, if a simulation tool were used, the length of the extended portion 217 of the cavity 215 is considered sufficiently long and/or the depth of the extended portion 217 is considered sufficiently deep is when color marks by simulation tool showing strong E-field are not present on the substrate 110 during the analysis.

In the embodiment shown in FIG. 2A, the thickness of the acoustic stack 250 may be about 1.5 μm, the depth of the extended portion 217 of the cavity 215 may be about 2 μm and the length of the extended portion of the cavity may be about 5 μm, for example. Depending on the size of the BAW resonator, a total length of the cavity 215 may be anywhere from about 50 μm to about 500 μm. Of course, the above values may vary to provide unique benefits for any particular situation or to meet application specific design requirements of various implementations, as would be apparent to one skilled in the art.

Improvement of the nonlinear response of a single resonator to the parasitic E-field 163 by the substrate 110 and/or reduction of the electrical loss generated in the substrate 110 can be observed by looking at the signal-to-noise (SNR) ratio, third order intermodulation distortion product (IMD3) and/or parallel resistance (Rp) measurements, for example, as will be discussed below with reference to FIG. 13 and FIG. 14. The discussion in the preceding three paragraphs, as well as other discussion, may be applicable to all the embodiments discussed herein after relating to electrical loss.

Referring to FIG. 2B, the top plan view of the BAW resonator 200 shows the top electrode 140 stacked over the piezoelectric layer (not shown for the sake of convenience), the bottom electrode 120 and the cavity 215. The outer edges of the cavity 215 are dashed lines, indicating that the cavity 215 is located beneath at least one of the top electrode 140, the bottom electrode 120 and the piezoelectric layer 130, and therefore would not be otherwise visible from the perspective of FIG. 2B. The extended portion 217 of the cavity 215 is shown extending beyond the connecting strip 140'. In alternative configurations, the extended portion 217 may end short of the connecting strip 140' or in alignment with the connecting strip 140', without departing from the scope of the present teachings. The substrate 110 is also not shown in FIG. 2B for the sake of convenience.

The E-field 160 generated in the BAW resonator 200 in response to the electrical excitation provided via the connecting strip 140' is indicated by E-field lines beginning at the bottom surface of the top electrode 140 and terminating at the bottom electrode 120. Notably, as shown in FIG. 2A, the parasitic E-field 163 passes through the cavity 215 (mostly through the extended portion 217), as opposed to the substrate 110, to terminate at the bottom electrode 120 (on its bottom surface). For purposes of illustration, the cavity 215 is filled with gas, such as air, which is a highly linear medium, particularly as compared to the nonlinear material of the substrate 110, such as silicon (Si). Alternatively, the cavity 215 (as well as cavities in the other embodiments of the BAW resonator, discussed herein) may be filled with gas other than air, such as helium, argon, nitrogen, carbon dioxide or various combinations of gases, for example, without departing from the scope of the present teachings. Or, the cavity 215 (as well as the cavities in the other embodiments of the BAW resonator, discussed herein) may be a vacuum, without departing from the scope of the present teachings.

Ideally, the cavity 215 is deep enough into the substrate 110, and extends far enough under the connecting strip 140', that none of the parasitic E-field 163 passes through the substrate 110, as shown in FIG. 2A. This would effectively generate no nonlinear response in the BAW resonator 200 due to the parasitic E-field 163 in the substrate 110. This results in improved (i.e., more linear) overall nonlinear response and improved (i.e., less) electrical loss of the BAW resonator 200. In an alternative configuration, the cavity 215 may be a vacuum, which provides essentially the same results as the gas-filled cavity 215.

As a practical matter, a small portion of the parasitic E-field 163 may pass through the substrate 110. Also, a small nonlinear response may result from portions of the parasitic E-field 163 passing through the cavity 215 or other components of the BAW resonator 200, such as the piezoelectric layer 130. However, such nonlinear responses would be minimal, and would generate little to no nonlinear current that would materially affect performance of the BAW resonator 200, or a device (e.g., acoustic filter) in which the BAW resonator 200 may be included. Generally, it is desirable for the extended portion 217 (as well as the extended portions in the other embodiments, discussed below) to reduce the nonlinear response of the substrate 110 by an amount that makes the nonlinear response of the substrate 110 less than the small nonlinear response generated by the piezoelectric layer 130 (and/or generated by other components of the BAW resonator 200).

In addition, the extended portion 217 of the cavity 215 may improve the acoustic response of the BAW resonator 200, as well. Generally, the improved acoustic response results from the acoustic waves generated by the acoustic stack 250 cannot be transmitted through the air (or other gas) or the vacuum of the extended portion 217. Therefore, the extended portion 217 functions as an energy confinement feature that confines acoustic energy, which would otherwise have dissipated through the substrate 110, inside the acoustic stack 250. Energy confinement features improve various acoustic performance parameters of the BAW resonator 200, such as quality factor (Q-factor), parallel resistance (Rp), and coupling coefficient $kt^2$, for example. The functionality of an extended portion of a substrate cavity as an energy confinement feature applies to each embodiment herein having one or more extended portions filled with air (or other gas) or being a vacuum.

FIGS. 3A and 3B are simplified cross-sectional and top plan views of a BAW resonator including an extended cavity, according to a representative embodiment, where FIG. 3A is the cross-section taken along line A-A' of FIG. 3B.

Referring to FIG. 3A, BAW resonator 300 is an FBAR, and includes the substrate 110 with a cavity 315 formed in a top surface of the substrate 110. In the depicted embodiment, a trap layer 111 is formed at upper surfaces of the substrate 110, including a top surface of the substrate 110 and surfaces of the substrate 110 forming the sides and bottom of the cavity 315. Similar to the BAW resonator 100, discussed above, the BAW resonator 300 includes bottom electrode 120 disposed over the substrate 110, the trap layer 111 and the cavity 315, piezoelectric layer 130 disposed over the bottom electrode 120, and top electrode 140 is disposed over the piezoelectric layer 130, forming an acoustic stack 350. An active region 355 of the acoustic stack 350 includes overlapping portions of an inner portion 316 of the cavity 315 (discussed below), the bottom electrode 120, the piezoelectric layer 130 and the top electrode 140. An outer perimeter of the active region 355 is indicated by a pair of (vertical) dashed lines. The BAW resonator 300 also includes the connecting strip 140' extending from a portion of the top electrode 140.

In the depicted embodiment, the cavity 315 includes the inner portion 316 within the active region 355, as mentioned above, and an extended portion 317 extending from the outer perimeter of the active region 355 underneath the connecting strip 140'. The inner portion 316 is filled with gas (or is a vacuum) and the extended portion 317 is filled with an electrically insulating material 318 that is highly linear, such as non-etchable borosilicate glass (NEBSG), doped or undoped silicon dioxide ($SiO_2$), aluminum nitride (AlN) or silicon carbide (SiC), for example, although other linear electrically insulating materials may be incorporated without departing from the scope of the present teachings.

The electrically insulating material 318, which may be a dielectric material, provides a more linear response to any portion of the parasitic E-field 163, beginning at the top electrode 140 and passing through the electrically insulating material 318 and terminating at the bottom electrode 120, than any portion of the parasitic E-field 163 beginning at the top electrode 140 and passing through the substrate 110 and terminating at the bottom electrode 120. Stated differently, the electrically insulating material 318 is more linear than the substantially nonlinear material of the substrate 110.

As stated above, in the depicted embodiment, the trap layer 111 is at the upper surfaces of the substrate 110, including the surfaces forming the sides and bottom of the cavity 315. More particularly, the substrate 110 of the BAW resonator 300 comprises a surface region, referred to herein as the trap layer 111 for the sake of illustration, and a bulk region (i.e., substantially the remainder of the substrate 110). The trap layer 111 has an increased bandgap, high trap density (i.e., high probability of trapping free charge carriers), and/or reduced carrier mobility, as compared to the bulk region of the substrate 110. The trap layer 111 is able to reduce some nonlinearities of the substrate 110. Therefore, although the trap layer 111 does not significantly disturb the E-field pattern within the substrate 110, it does reduce the strength of the nonlinear currents that are induced in the BAW resonator 300 by the presence of the nonlinear substrate 110 in response to the parasitic E-field 163 beginning at the top electrode 140 and passing through the substrate 110 to terminate at the bottom electrode 120, in conjunction with the electrically insulating material 318 in the extended portion 317 of the cavity 315.

Generally, the trap layer 111 is formed by converting a monocrystalline structure in a surface region of the substrate 110 into an amorphous or polycrystalline structure, thereby increasing the bandgap, increasing the trap density and reducing carrier mobility (e.g., by at least 100 times). For example, the trap layer 111 may be the same material (e.g., Si) as the substrate 110, where the lattice structure of the substrate 110 within the surface region (trap layer 111) is changed (e.g., damaged or destroyed). This may be achieved, for example, by forming a polycrystalline or amorphous material out of the material of the substrate 110, as mentioned above. Description of trap layers (high trap density surface regions) is provided by Handtmann et al., U.S. Pat. No. 7,728,485 (issued Jun. 1, 2010), which is hereby incorporated by reference in its entirety.

Inclusion of the trap layer 111 increases resistance at the surface of the substrate 110, as well as at the interface between the substrate 110 and the layer above it (e.g., the bottom electrode 120 and/or the piezoelectric layer 130), thus reducing resistive dissipation and nonlinear currents from flowing in the surface of the substrate 110. The trap layer 111 also reduces overall parasitic nonlinearity (indicated by nonlinear element 780-2 in FIG. 7) by reducing the voltage dependence R(V) and C(V) therein.

Figure 8:
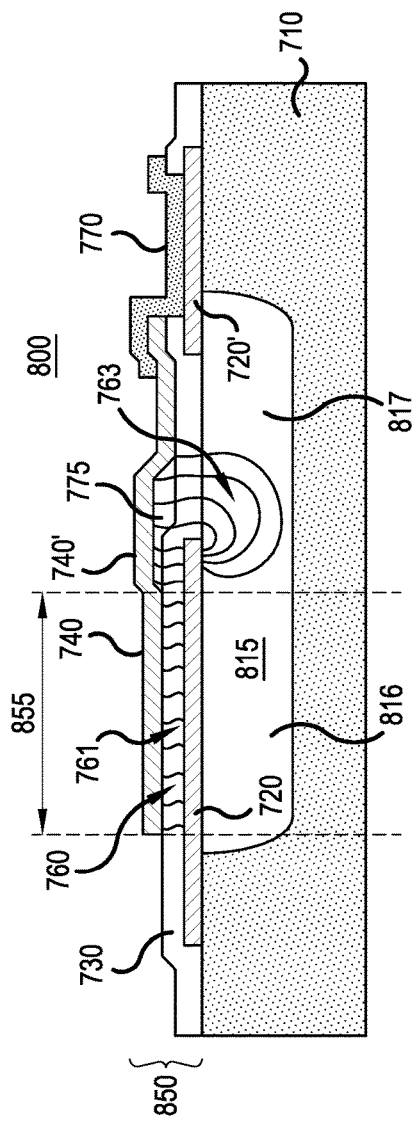
FIG. 8 is a simplified cross-sectional view of a BAW resonator including an extended cavity and an air-bridge, according to a representative embodiment.

By removing a portion of the substrate 110 under the connect strip 140' (extended portion 317 in the embodiment depicted in FIG. 3A), essentially all nonlinear currents are prevented from flowing in the substrate 110. The parasitic E-field 163 spreads out as it passes though the extended portion 317 and is thus weakened when it reaches the surface of the substrate 110 at the bottom of the cavity 315. However, sufficient parasitic E-field 163 may still be present and able to pass through the substrate 110 at the bottom of cavity 315. The trap layer 111, though, weakens the nonlinear response in the substrate 110 in the presence of the parasitic E-field 163. That is, the bottom of the cavity 315, including the extended portion 317, has been "passivated" using the trap layer 111. The trap layer 111 also reduces the flow of nonlinear currents that would have flowed at the interface between the insulting material 318 and the (semi-conductor) substrate 110. Notably, the deeper the cavity 315, the weaker the parasitic E-field 163 will be at the bottom surface of the cavity 315, and thus smaller the nonlinear currents (and loss) will be induced by the parasitic E-field 163. This is particularly the case in FIGS. 3A-3B, as well as in FIGS. 4A-4B, 5A-5B, 6A-6C, 9, 10 and 11, discussed below, where the extended portion(s) are filled with an electrically insulating material (318, 418, 518, 918, 1018, 1118), which is less effective at preventing the parasitic E-field (163, 763) from passing through the substrate (110, 710, 1110), than gas or a vacuum, as shown in FIGS. 2A-2B and 8, for example. Although, in alternative embodiments, each of the illustrative BAW resonators in FIGS. 3A-3B, FIGS. 4A-4B, 5A-5B, 6A-6C, 9, 10 and 11, may not include the trap layer 111, without departing from the scope of the present teachings.

Even with the use of a trap layer at the surface of the substrate, unwanted non-linear currents and resistive loses can flow along the interface between the trap layer and the acoustic stack or (resonator) membrane, which comprises the metal and piezoelectric layers of the BAW resonator. By placing a gap or cavity (e.g., gas filled or vacuum) or insulator directly below the membrane in place of the substrate (with the trap layer), such currents and losses can be essentially eliminated, even when the cavity is very thin (e.g. 10's of Angstroms). Additionally, when the cavity or insulator is deeper or thicker (e.g. a few microns or more), the strength of the E-field that impinges on the substrate (with the trap layer) at the bottom of the cavity is reduced because the E-field lines have spread at the surface where they impinge on the surface of the substrate. Accordingly, non-linear currents (and associated losses) at the newly created interface will also be mitigated.

Figure 12:
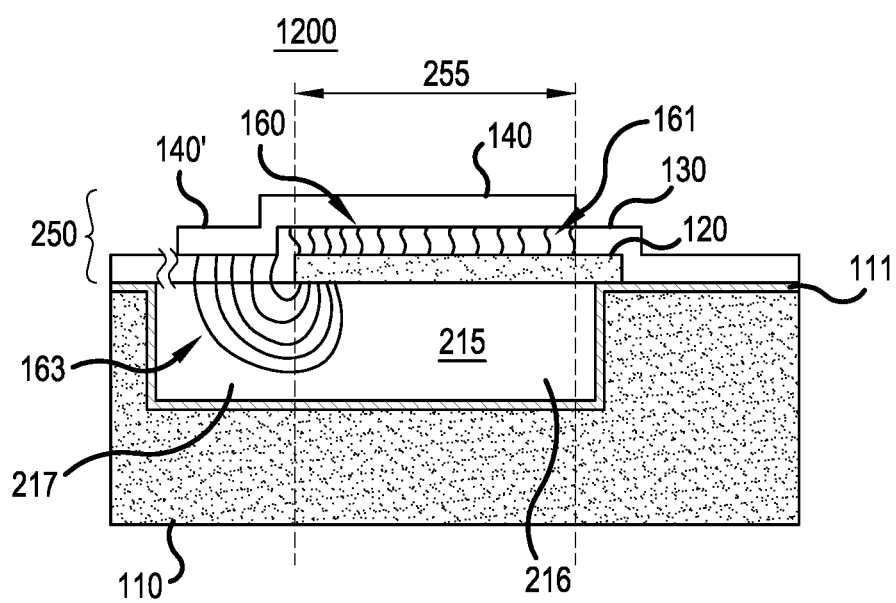
FIG. 12 is a simplified cross-sectional view of a BAW resonator including an extended cavity, as shown FIG. 2, with a trap layer on the substrate, according to a representative embodiment.

However, cavities and/or extended portions filled with gas or a vacuum may likewise benefit from the trap layer 111, an example of which is shown by the cross-section of BAW resonator 1200 in FIG. 12. This is particularly the case where the cavities and/or extended portions are relatively shallow, such that a larger portion of the parasitic E-field (163, 763) may otherwise penetrate into the substrate (110, 710, 1110).

Referring to FIG. 3B, the top plan view of the BAW resonator 300 shows the top electrode 140 stacked over the piezoelectric layer (not shown for the sake of convenience), the bottom electrode 120 and the cavity 315. The outer edges of the cavity 315 are dashed lines, indicating that the cavity 315 is located beneath at least one of the top electrode 140, the bottom electrode 120 and the piezoelectric layer 130, and therefore would not be otherwise visible from the perspective of FIG. 3B. The extended portion 317 of the cavity 315, filled with the electrically insulating material 318, is shown extending beyond the connecting strip 140'. In alternative configurations, the extended portion 317 may end short of the connecting strip 140' or in alignment with the connecting strip 140', without departing from the scope of the present teachings. The substrate 110 is also not shown in FIG. 3B for the sake of convenience.

The E-field 160 generated in the BAW resonator 300 in response to the electrical excitation provided via the connecting strip 140' is indicated by E-field lines beginning at the bottom surface of the top electrode 140 and terminating at the bottom electrode 120. Notably, as shown in FIG. 3A, the parasitic E-field 163 passes through the electrically insulating material 318 and the inner portion 316 of the cavity 315, as opposed to the substrate 110, to reach the bottom electrode 120. Ideally, the cavity 315 is deep enough into the substrate 110, and extends far enough under the connecting strip 140', that none of the parasitic E-field 163 passes through the substrate 110, as shown in FIG. 3A. That is, a length of the extended portion 317 is sufficiently long and sufficiently deep to substantially prevent the parasitic E-field 163 from passing through the substrate 110, as shown. In other words, a negligible amount of the parasitic E-field 163 passes through the substrate 110, such that a nonlinear response by the substrate 110 is improved and electrical loss generated in the substrate 110 is reduced.

In addition, a portion of the bottom electrode 120 sits on the electrically insulating material 318 of the extended portion 317. Accordingly, the electrically insulating material 318 provides enhanced structural support for the bottom electrode 120 (and thus the acoustic stack 350), as well as adherence of the acoustic stack 350 to the substrate 110. Also, because the electrically insulating material 318 is in contact with the bottom electrode 120, it provides thermal conductivity by conducting heat away from the acoustic stack 350. This improves power handling of the BAW resonator 300 (as compared, for example, to the BAW resonator 200 which has no electrically insulating material in the cavity 215). Improved power handling includes, for example, increasing an amount of power the BAW resonator 300 can handle without negatively affecting operation, and increasing a maximum power threshold, above which the BAW resonator 300 would be damaged or destroyed. In other words, by improving power handling, much higher power may be applied to the BAW resonator without it overheating or failing. Thus, if the electrically insulating material 318 is formed of a material (e.g., AlN or SiC) that is a good thermal conductor and is more linear than the material of the substrate 110, then power handling, nonlinear response to the parasitic E-field 163 by the substrate 110, and electrical loss generated in the substrate 110 all improve. Notably, the electrically insulating material 318 in the extended portion 317 may also function as an energy confinement feature, as discussed above with regard to the extended portion 217 in FIGS. 2A and 2B. However, the extent to which the extended portion 317 confines acoustic energy inside the acoustic stack 350 (if at all) depends on the material used for the electrically insulating material 318 and the thickness of the material (depth of the extended portion 317), as would be understood by one skilled in the art.

Of course, the respective properties of thermal conductivity and linearity of the electrically insulating material 318 may vary to provide unique benefits for any particular situation or to meet application specific design requirements of various implementations, as would be apparent to one skilled in the art. For example, the electrically insulating material 318 may provide good thermal conductivity, but have relatively high nonlinearity, in which case the improvement in power handling would be more significant than the improvement in nonlinearity and electrical loss. Similarly, the electrically insulating material 318 may provide poor thermal conductivity, but have a relatively high linearity, in which case the improvement in nonlinearity and electrical loss would be more significant than the improvement in power handling. Generally, it is desirable to incorporate an insulating material that has high electrical linearity (so not to degrade the linearity of the resonator), low electrical and mechanical loss properties (so not to degrade the Q-factor of the BAW resonator), and high thermal conductivity (to aid in producing a BAW resonator in which heat will flow from the acoustic stack through the insulator material and into the substrate at the connect edge of the resonator), all of which will ensure that the BAW resonator will have good power handling capability, the importance of which would be appreciated by one skilled in the art.

FIGS. 4A and 4B are simplified cross-sectional and top plan views of a BAW resonator including an extended cavity, according to a representative embodiment, where FIG. 4A is the cross-section taken along line A-A' of FIG. 4B.

Referring to FIG. 4A, BAW resonator 400 is an FBAR, and includes the substrate 110 with a cavity 415 formed in a top surface of the substrate 110, and a trap layer 111 formed at upper surfaces of the substrate 110, including surfaces forming the sides and bottom of the cavity 415. Similar to the BAW resonator 300, discussed above, the BAW resonator 400 includes bottom electrode 120 is disposed over the substrate 110 and the cavity 415, piezoelectric layer 130 disposed over the bottom electrode 120, and top electrode 140 is disposed over the piezoelectric layer 130, forming an acoustic stack 450. An active region 455 of the acoustic stack 450 includes overlapping portions of an inner portion 416 of the cavity 415 (discussed below), the bottom electrode 120, the piezoelectric layer 130 and the top electrode 140. An outer perimeter of the active region 455 is indicated by a pair of (vertical) dashed lines. The BAW resonator 400 also includes connecting strip 140' extending from a portion of the top electrode 140.

In the depicted embodiment, the cavity 415 includes the inner portion 416 within the active region 455, and extended portions 417, 417' extending from the outer perimeter of the active region 455 in different directions. The extended portion 417 extends underneath the connecting strip 140', like the extended portion 317 discussed above with reference to FIGS. 3A and 3B. The extended portion 417' extends in at least one direction not underneath the connecting strip. In the depicted embodiment, the extended portion 417' extends in a direction away from (opposite) the connecting strip 140' (in the cross-sectional view), although as seen in FIG. 4B, the extended portion 417' extends beyond the outer perimeter of the active region on all sides. The cavity 415 further includes a bottom portion 419 along the bottom surface of the cavity 415, defining the bottom of the inner portion 416. The bottom portion 419 is integral with the extended portions 417, 417'.

The inner portion 416 is filled with gas (or is a vacuum), and the extended portions 417, 417' and the bottom portion 419 comprise an electrically insulating material 418, which is highly linear, such as NEBSG, doped or undoped $SiO_2$, AlN or SiC, for example, although other linear electrically insulating materials may be incorporated without departing from the scope of the present teachings. The electrically insulating material 418 has the same characteristics (e.g., more linear electrically insulating materials) and provides the same functions as the electrically insulating material 318 in FIGS. 3A and 3B, which therefore will not be repeated in detail. Such functions include providing a path for the parasitic E-field 163 from the top electrode 140 the bottom electrode 120 that does not pass through the substrate 110, or passes through a very small (negligible) portion of the substrate, such that a nonlinear response to the parasitic E-field 163 by the substrate 110 is improved and electrical loss generated in the substrate 110 is reduced. Also, the electrically insulating material 418 provides structural support for the bottom electrode 120, and a thermally conductive path from the acoustic stack 450, such that power handling of the BAW resonator 400 is improved, for example, over the embodiment in FIGS. 2A and 2B.

In the depicted embodiment, the bottom portion 419 is integral with the extended portions 417, 417', which results from the particular etching/fabrication process. That is, FIG. 4A depicts the result of a process in which the cavity 415 is filled with the electrically insulating material 418, and then the inner portion 416 is etched (e.g., using an etch mask) partially through the insulating material 418 toward the bottom of the cavity 415. In other embodiments, there is no bottom portion 419, in which case the inner portion 416 extends to the bottom of the cavity 415 (ending at the substrate 110). This would result, for example, from a process in which the cavity 415 is filled with the electrically insulating material 418, and then the inner portion is etched completely through the insulating material 418. Alternatively, the corresponding process may include adding the electrically insulating material 418 only in the extended portions 417 and 417', for example, by initially filling the inner portion 416 with a sacrificial material (e.g., PSG), which is removed after the electrically insulating material 418 fills the extended portions 417 and 417'.

Referring to FIG. 4B, the top plan view of the BAW resonator 400 shows the top electrode 140 stacked over the piezoelectric layer (not shown for the sake of convenience), the bottom electrode 120, inner portion 416 of the cavity 415 and the extended portions 417, 417' of the cavity 415. The outer edges of the inner portion 416 and the extended portions 417, 417' are dashed lines, indicating that they are located beneath at least one of the top electrode 140, the bottom electrode 120 and the piezoelectric layer 130, and therefore would not be otherwise visible from the perspective of FIG. 4B. The extended portions 417, 417' of the cavity 415, filled with the electrically insulating material 418, are shown extending beyond the top electrode 140 and the bottom electrode 120 on all sides, and also extending beyond the connecting strip 140'. In alternative configurations, the cavity 415 may not extend beyond the bottom electrode 120 on one or more sides (or edges) of the bottom electrode 120, without departing from the scope of the present teachings. Also, the extended portion 417 may end short of the connecting strip 140' or in alignment with the connecting strip 140', without departing from the scope of the present teachings. The substrate 110 is also not shown in FIG. 4B for the sake of convenience.

As discussed above, the E-field 160 generated in the BAW resonator 400 in response to the electrical excitation provided via the connecting strip 140' is indicated by E-field lines. As shown in FIG. 4A, the parasitic E-field 163 passes through the electrically insulating material 418, as opposed to the substrate 110, to reach the bottom electrode 120. Ideally, the cavity 415 is deep enough into the substrate 110, and extends far enough under the connecting strip 140', that none of the parasitic E-field 163 passes through the substrate 110, as shown in FIG. 4A, such that a nonlinear response by the substrate 110 is improved and electrical loss generated in the substrate 110 is reduced, as discussed above with reference to FIGS. 3A and 3B. As a practical matter, a small amount of the parasitic E-field 163 may pass through the substrate 110, such that there would be no material affect on the nonlinearity of the BAW resonator 400, without departing from the scope of the present teachings.

In the foregoing embodiments, each of the BAW resonators 200, 300 and 400 include at least an extended portion 217, 317 and 417 that extends underneath the connecting strip 140'. The embodiment shown in FIGS. 4A and 4B further include an additional extended portion 417' that extends in a direction away from the connecting strip 140' (in the cross-sectional view). It is understood, however, that additional extended portions of the cavities 215, 315 and 415 may extend in any direction(s) other than underneath the connecting strip 140' without departing from the scope of the present teachings. Further, various embodiments may not include any portion of the cavities 215, 315 and 415 that extend under the connecting strip 140'. Rather, any extended portion(s) extend only in direction(s) other than (e.g., away from) the connecting strip 140'.

FIGS. 5A and 5B are simplified cross-sectional and top plan views of a BAW resonator including an extended cavity, according to a representative embodiment, where FIG. 5A is the cross-section taken along line A-A' of FIG. 5B.

Referring to FIG. 5A, BAW resonator 500 is an FBAR, and includes substrate 110, and an interposer layer 517 disposed over the substrate 110 and trap layer 111 formed at upper surfaces of the substrate 110 (i.e., the top surface in FIG. 5A). The interposer layer 517 is formed of an electrically insulating material 518 that is highly linear, such as NEBSG, doped or undoped $SiO_2$, AlN or SiC, for example, although other linear electrically insulating materials may be incorporated without departing from the scope of the present teachings. The electrically insulating material 518 has the same characteristics (e.g., more linear electrically insulating materials) and provides the same functions as the electrically insulating material 318 described above with reference to FIGS. 3A and 3B, which therefore will not be repeated in detail. A cavity 515 is formed in a top surface of the interposer layer 517, as opposed to in a top surface of the substrate 110.

Similar to the BAW resonator 300, discussed above, the BAW resonator 500 further includes bottom electrode 120 disposed over the substrate 110 and the cavity 515, piezoelectric layer 130 disposed over the bottom electrode 120, and top electrode 140 disposed over the piezoelectric layer 130, forming an acoustic stack 550. An active region 555 of the acoustic stack 550 includes overlapping portions of the cavity 515, the bottom electrode 120, the piezoelectric layer 130 and the top electrode 140. An outer perimeter of the active region 555 is indicated by a pair of (vertical) dashed lines. The BAW resonator 500 also includes connecting strip 140' extending from a portion of the top electrode 140.

The cavity 515 is filled with gas (or is a vacuum). Since the cavity 515 is formed in the interposer layer 517, as opposed to the substrate 110, it does not include any extended portion(s) extending underneath the connecting strip 140'. Rather, the interposer layer 517 provides a path for the parasitic E-field 163 from the top electrode 140 to the bottom electrode 120 that does not pass through the substrate 110, or a negligible amount of the parasitic E-field 163 through a portion of the substrate, such that a nonlinear response to the parasitic E-field by the substrate 110 is improved and electrical loss generated in the substrate 110 is reduced. Also, the electrically insulating material 518 of the interposer layer 517 provides structural support for the bottom electrode 120, and a thermally conductive path from the acoustic stack 550, such that power handling of the BAW resonator 500 is improved.

Referring to FIG. 5B, the top plan view of the BAW resonator 500 shows the top electrode 140 stacked over the piezoelectric layer (not shown for the sake of convenience), the bottom electrode 120, the cavity 515 and the interposer layer 517. The outer edges of the cavity 515 are dashed lines, indicating that they are located beneath at least one of the top electrode 140, the bottom electrode 120 and the piezoelectric layer 130, and therefore would not be otherwise visible from the perspective of FIG. 5B. The interposer layer 517 formed of the electrically insulating material 518 is shown extending beyond the top electrode 140 and the bottom electrode 120 on all sides, and also extending beyond the connecting strip 140'. In alternative configurations, the interposer layer 517 may not extend beyond the bottom electrode 120 on one or more sides (or edges) of the bottom electrode 120, without departing from the scope of the present teachings. Also, the interposer layer 517 may end short of the connecting strip 140' or in alignment with the connecting strip 140', without departing from the scope of the present teachings. The substrate 110 is also not shown in FIG. 5B for the sake of convenience.

As discussed above, the E-field 160 generated in the BAW resonator 500 in response to the electrical excitation provided via the connecting strip 140' is indicated by E-field lines. As shown in FIG. 5A, the parasitic E-field 163 passes through the electrically insulating material 518 of the interposer layer 517, as opposed to the substrate 110, to reach the bottom electrode 120. Ideally, the interposer layer 517 is thick enough that none of the parasitic E-field 163 passes through the substrate 110, as shown in FIG. 5A, such that a nonlinear response by the substrate 110 is improved and electrical loss generated in the substrate 110 is reduced, as discussed above with reference to FIGS. 3A and 3B. As a practical matter, a small amount of the parasitic E-field 163 may pass through the substrate 110, such that there would be no material affect on the nonlinearity of the BAW resonator 500, without departing from the scope of the present teachings. As shown in FIG. 5A, the parasitic E-field 163 passes through the electrically insulating material 518, as opposed to the substrate 110, to terminate at the bottom electrode 120. In alternative embodiments (not shown), the cavity 515 may extend through the entire thickness of the interposer layer 517 and partially into the substrate 110, without departing from the scope of the present teaches. In this case, it is still understood that the interposer layer 517 is thick enough and/or the cavity 515 is deep enough in the substrate 110, that again, the strength of the E-field is weaker at the interface (between the interposer layer 517 and the substrate 110) because the interface is separated from the region where the parasitic E-field 163 is the largest (where the metal electrodes are closely spaced apart) by the thickness of the interposer layer 517.

By adding the interposer layer 517, nonlinear currents induced by weaker E-fields than those that are shown in FIG. 5A are also eliminated. These weaker E-fields have corresponding electric lines of force beginning at the top electrode 140 and terminating at bottom electrodes in other parts of the BAW circuit (not shown in FIG. 5A because they are either out of the plane of FIG. 5A or are on the side of the connect edge opposite to where the acoustic stack is shown in FIG. 5A.

In the embodiment depicted in FIGS. 5A and 5B, the strength of all E-fields that penetrate into the substrate 110 is reduced by incorporation of the interposer layer 517 as compared to the other embodiments described herein. In the other embodiments, the parasitic E-field 163 is typically the strongest in the area of the substrate 110 directly underneath the connect edge. However, in the present embodiment, the parasitic E-field 163 that would have appeared in the substrate 110 directly below the connect edge now primarily resides inside of the linear material of the interposer layer 517. The magnitude of the parasitic E-field 163 that penetrates into the substrate 110 below the interposer layer 517 (particularly directly underneath the connect edge) will be greatly reduced, thus diminishing the nonlinear currents that will be induced in the BAW resonator by the parasitic E-field 163.

Each of the BAW resonators 200, 300, 400 and 500 depicted in FIGS. 3A through 5B, above, include one connecting strip 140' extending from a portion of the corresponding top electrode 140. However, in alternative embodiments, a BAW resonator may have multiple connecting strips extending from different portions (e.g., different edges) of the top electrode, without departing from the scope of the present teachings. Also, with regard to the BAW resonators 200, 300 and 400, in particular, they may further include additional extended portions of the cavities, each extended portion extending from the outer perimeter of the active region under a corresponding additional connecting strip, without departing from the scope of the present teachings.

Figure 6A:
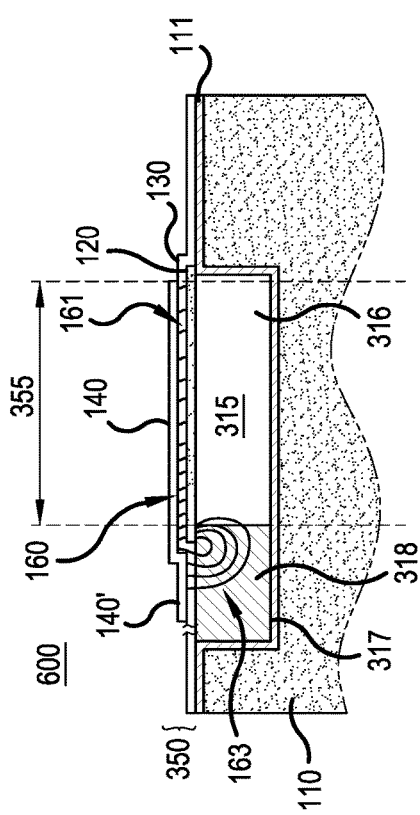
FIGS. 6A, 6B and 6C are simplified cross-sectional and top plan views of a BAW resonator including multiple (e.g., two) extended cavities, according to a representative embodiment.
Figure 6B:
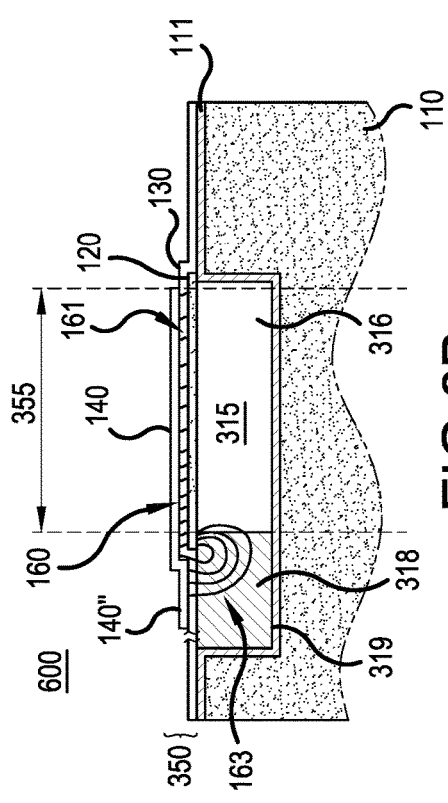
Figure 6C:
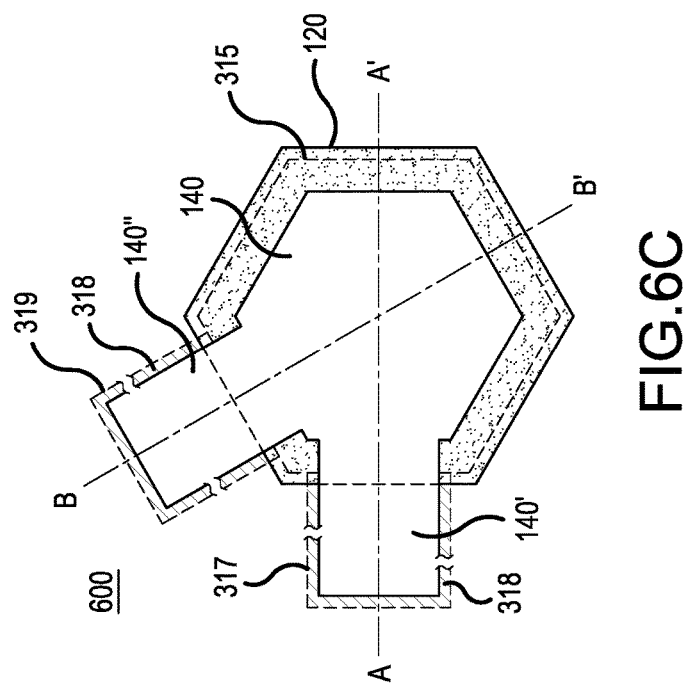

FIGS. 6A, 6B and 6C are simplified cross-sectional and top plan views of a BAW resonator including multiple (e.g., two) extended cavities and connecting strips, according to a representative embodiment, where FIGS. 6A and 6B provide cross-sections taken along lines A-A' and B-B' of FIGS. 6C and 6B, respectively.

Referring to FIG. 6A, BAW resonator 600 is an FBAR, and includes substrate 110 with a cavity 315 formed in a top surface of the substrate 110, and a trap layer 111 formed at upper surfaces of the substrate 110, including surfaces forming the sides and bottom of the cavity 315. The cross-section of the BAW resonator 600 in FIG. 6A is substantially the same as the cross-section of the BAW resonator 300 shown in FIG. 3A, so description of the relevant features will not be repeated. Referring to FIG. 6B, the BAW resonator 600 includes bottom electrode 120 is disposed over the substrate 110, the cavity 315 and the trap layer 111, piezoelectric layer 130 disposed over the bottom electrode 120, and top electrode 140 is disposed over the piezoelectric layer 130, forming acoustic stack 350. An active region 355 of the acoustic stack 350 includes overlapping portions of an inner portion 316 of the cavity 315, the bottom electrode 120, the piezoelectric layer 130 and the top electrode 140. An outer perimeter of the active region 355 is indicated by a pair of (vertical) dashed lines. The BAW resonator 600 also includes additional connecting strip 140", as well as the connecting strip 140', extending from another portion of the top electrode 140 than the portion of the top electrode 140 from which the connecting strip 140' extends.

Thus, in the depicted embodiment, the cavity 315 includes the inner portion 316 within the active region 355, the extended portion 317, and an additional extended portion 319 extending from (another section of) the outer perimeter of the active region 355 underneath the additional connecting strip 140". The inner portion 316 is filled with gas (or is a vacuum) and each of the extended portions 317 and the additional extended portion 319 is filled with an electrically insulating material 318 that is highly linear, such as NEBSG, doped or undoped $SiO_2$, AlN or SiC, for example, although other linear electrically insulating materials may be incorporated without departing from the scope of the present teachings.

Referring to FIG. 6C, the top plan view of the BAW resonator 600 shows the top electrode 140 stacked over the piezoelectric layer (not shown for the sake of convenience), the bottom electrode 120 and the cavity 315. The outer edges of the cavity 315 are dashed lines, indicating that the cavity 315 is located beneath at least one of the top electrode 140, the bottom electrode 120 and the piezoelectric layer 130, and therefore would not be otherwise visible from the perspective of FIG. 6C. The extended portion 317 and the additional extended portion 319 of the cavity 315, filled with the electrically insulating material 318, are shown extending beyond the connecting strip 140' and the additional connecting strip 140", respectively. In alternative configurations, the extended portion 317 and/or the additional extended portion 317 may end short of the connecting strips 140' and/or 140", or in alignment with the connecting strips 140' and/or 140", without departing from the scope of the present teachings. The substrate 110 is also not shown in FIG. 6C for the sake of convenience.

The E-field 160 generated in the BAW resonator 600 in response to the electrical excitation provided via the connecting strip 140' and the additional connecting strip 140" is indicated by E-field lines extending from the bottom surface of the top electrode 140 to the bottom electrode 120. Notably, as shown in FIGS. 6A and 6B, the parasitic E-field 163 passes through the electrically insulating material 318 in each of the extended portion 317 and the additional extended portion 319, as well as the inner portion 316 of the cavity 315 to terminate at the bottom electrode 120. Thus, as discussed above, a negligible amount of the parasitic E-field 163 pass through the substrate 110, such that a nonlinear response by the substrate 110 is improved and electrical loss generated in the substrate 110 is reduced.

Further, because both the extended portion 317 and the additional extended portion 319 are filled with the electrically insulating material 318 as opposed to gas (or are vacuums), for example, multiple portions of the bottom electrode 120 sit on the electrically insulating material 318. Accordingly, the electrically insulating material 318 provides more enhanced structural support for the bottom electrode 120 (and thus the acoustic stack 350). Also, because the electrically insulating material 318 is in contact with the bottom electrode 120, it provides additional thermal conductivity by conducting heat away from the acoustic stack 350 through the electrically insulating material in both the extended portion 317 and the additional extended portion 319. This improves power handling of the BAW resonator 300.

Although FIGS. 6A-6C depict a BAW acoustic resonator having a configuration similar to FIGS. 3A and 3B with regard to the structure of the cavity and extend portion(s) of the cavity in the substrate (and the electrically insulating material therein), it is understood that the BAW acoustic resonators 200 and 400 of FIGS. 2A, 2B and 4A, 4B may similarly have cavities having multiple extended portions, as shown in FIGS. 6A-6C, with or without electrically insulating material. Further, for each of these configurations, there may be more than one additional extended portion of the cavity, extending from (other sections of) the outer perimeter of the active region, without departing from the scope of the present teachings.

Figure 7:
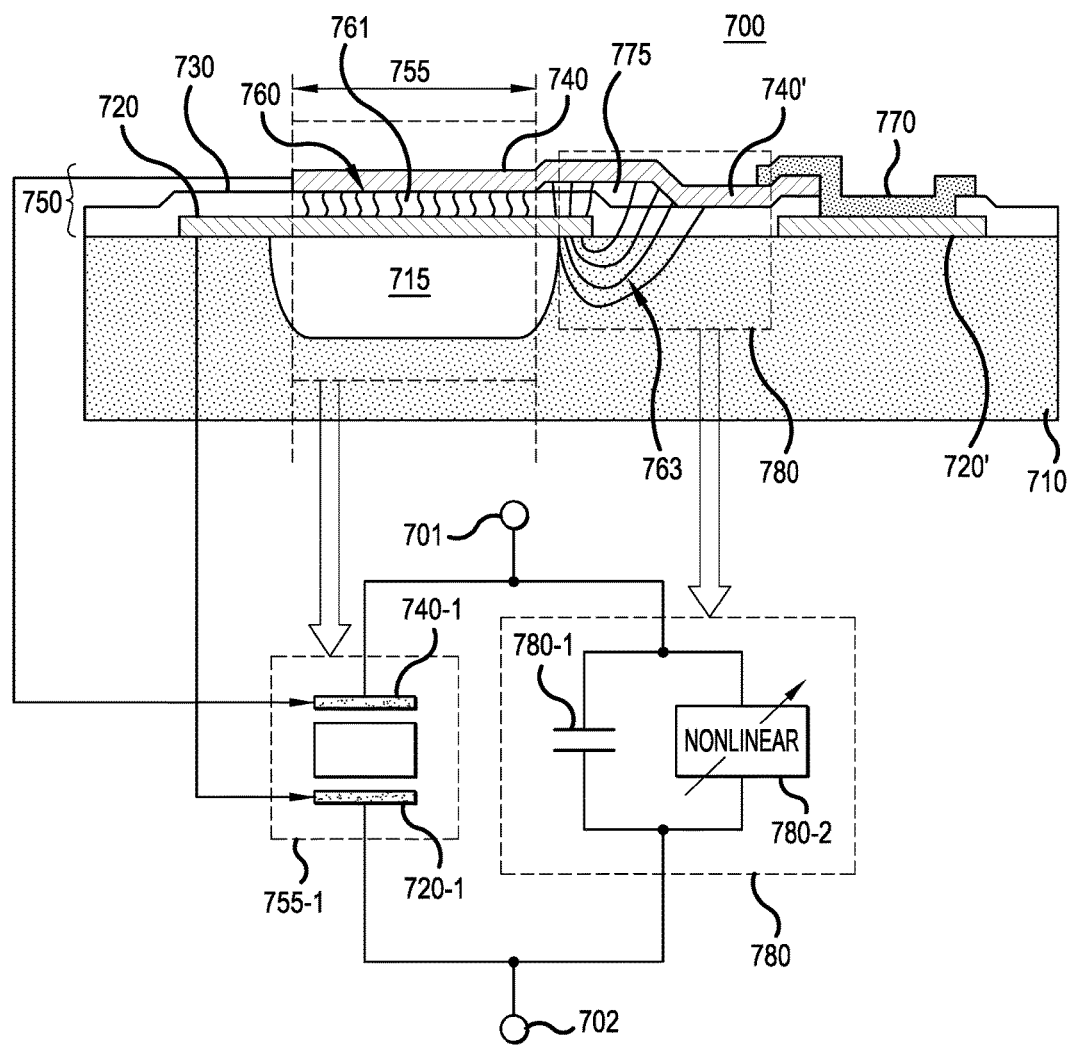
FIG. 7 is a simplified cross-sectional view of a BAW resonator including a cavity and an air-bridge and a corresponding circuit.
Figure 9:
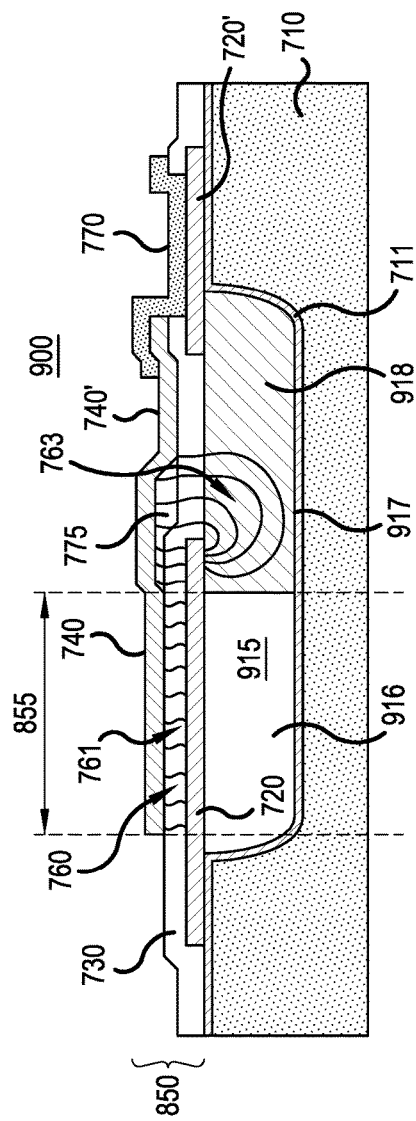
FIG. 9 is a simplified cross-sectional view of a BAW resonator including an extended cavity and an air-bridge, according to a representative embodiment.

Notably, BAW resonators, including FBARS, may include energy confinement features to improve various performance parameters, such as Q-factor, parallel resistance (Rp), and coupling coefficient $kt^2$, for example. Such features include air-bridges, air-wings, inner and outer frames, collars, and the like, which may generally suppress electrically excited piston mode in the frame region, and reflect and otherwise resonantly suppress propagating eigenmodes in lateral directions, which improve operation of the acoustic resonator device. Examples of such features are described by BURAK et al., 2012/0218060 (published Aug. 30, 2012) and BURAK et al., U.S Patent App. Pub. No. 2015/0280687 (published Oct. 1, 2015), the contents of each of which are hereby incorporated by reference in their entireties. Examples of air-bridges and/or air-wings, in particular, are described by BURAK et al., U.S. Patent Application Publication No. 2012/0218057 (published Aug. 30, 2012), CHOY et al., U.S. Patent Application Publication No. 2010/0327697 (published Dec. 30, 2010), and CHOY et al., U.S. Patent Application Publication No. 2010/0327994 (published Dec. 30, 2010), the contents of which are hereby incorporated by reference in their entireties. The BAW resonators 200, 300, 400 and 500, which are configured to reduce or eliminate respective parasitic E-fields 163 from passing through substrate 110, as discussed above, may include one or more such features, without departing from the scope of the present teachings. For example, FIG. 7 is a simplified cross-sectional view of a BAW resonator without an extended portion of the cavity. The BAW resonator as shown in FIG. 7 includes an air-bridge as an illustrative energy confinement feature, and FIGS. 8 to 10 are simplified cross-sectional views of BAW resonators including extended cavities and air-bridges, according to representative embodiments.

In addition to the simplified cross-sectional view of the BAW resonator, FIG. 7 also includes a circuit diagram indicating circuitry corresponding to various features of the BAW resonator depicted in the cross-sectional view. A corresponding top plan view is not included for the sake of convenience, although such top plan view would be similar to FIG. 1B, with the addition of the air-bridge and a contact pad configured to pass electrical signals, as discussed below.

Referring to FIG. 7, BAW resonator 700 is an FBAR with an air-bridge 775. The BAW resonator 700 includes a substrate 710 and a cavity 715 formed in a top surface of the substrate 710 as an acoustic reflector. A first (bottom) electrode 720 is disposed over the substrate 710 and the cavity 715, including a remote portion 720' of the bottom electrode 720 positioned beneath a metal contact pad 770 configured to pass electrical signals. A piezoelectric layer 730 is disposed over the bottom electrode 720, and a second (top) electrode 740 is disposed over the piezoelectric layer 730. The bottom electrode 720, the piezoelectric layer 730 and the top electrode 740 form an acoustic stack 750. An active region 755 of the acoustic stack 750 includes overlapping portions of the cavity 715, the bottom electrode 720, the piezoelectric layer 730 and the top electrode 740, and is defined on at least one side by an inner edge of the air-bridge 775. An outer perimeter of the active region 755 is indicated by a pair of (vertical) dashed lines. The BAW resonator 700 also includes a connecting strip 740' extending from a portion of the top electrode 740, as discussed in more detail below. It is understood that the respective materials forming the substrate 710, the bottom electrode 720, the piezoelectric layer 730 and the top electrode 740 (and the passivation layer), respectively, are the same as discussed above with reference to the substrate 110, the bottom electrode 120, the piezoelectric layer 130 and the top electrode 140, discussed above, and therefore are not repeated.

The connecting strip 740' provides electrical excitation of the acoustic stack 750 through the top electrode 740. In particular, the connecting strip 740' contacts the metal contact pad 770, which receives electrical signals, e.g., by way of a via or other conductor electrically connected to the metal contact pad 770. The metal contact pad may be formed of gold (Au), for example.

An E-field 760 is generated in the BAW resonator 700 in response to the electrical excitation, indicated by E-field lines. A portion of the E-field 760 generated from the top electrode 740 through the piezoelectric layer 730 and terminating at the bottom electrode 720 within the active region 755 of the acoustic stack 750 may be referred to as an operational E-field 761. Another portion of the E-field 760 beginning at the top electrode 740 outside the active region 755 and terminating at the bottom electrode 720 may be referred to as a parasitic E-field 763. At least a portion of the parasitic E-field 763 passes through the substrate 710 (and possibly through a portion of the cavity 715) to terminate at the bottom electrode 720 (on its bottom surface). For purposes of illustration, the substrate 710 is formed of a nonlinear material (e.g., Si), resulting in a nonlinear response of the BAW resonator 700 to the parasitic E-field 763.

As mentioned above, FIG. 7 also includes a circuit diagram indicating circuitry corresponding to various features of the BAW resonator 700. The active region 755 corresponds to active resonator 755-1 (indicated by a dashed box), which in the circuit diagram includes bottom electrode 720-1 and top electrode 740-1. The E-field lines indicating the parasitic E-field 763 correspond to parallel shunt circuit elements in parallel with the active resonator 755-1, connected between device terminals 701 and 702. In particular, a parasitic E-field area 780, in which the air-bridge 760, a portion of the top electrode 740, a portion of the piezoelectric layer 730 overlap and contact a portion of the substrate 710 (beside the cavity 715). The parasitic E-field are 780 is indicated by a dashed box, and includes linear and nonlinear characteristics.

Referring to the circuit diagram, the parasitic E-field area 780 is represented by a shunt element (indicated by a dashed box) in parallel with the active resonator 755-1. The shunt element includes shunt linear capacitor 780-1 connected in parallel with shunt nonlinear component 780-2, a portion of which represents the substrate 710 in which the parasitic E-field 763 is present. That is, the shunt nonlinear component 780-2 represents nonlinear characteristics of each of the components included in the parasitic E-field area 780 through which the parasitic E-field 763 passes (i.e., the air-bridge 775, the piezoelectric layer 730 and the substrate 710), although the air-bridge 775 and the piezoelectric layer 730 are linear materials with minimal nonlinear characteristics.

When the BAW resonator 700 is excited by an applied voltage stimulus, across the top and bottom electrodes 740 and 720, through the metal contact pad 770 and the connecting strip 740', the parasitic E-field 763, beginning at top electrode 740 and terminating at the bottom electrode 720 passes through the air-bridge 775 and the piezoelectric layer 730 formed of linear material (e.g., AlN), as well as the substrate 710 formed of nonlinear material (e.g., Si), indicated by the parasitic E-field area 780. As mentioned above, the shunt linear capacitor 780-1 in the circuit diagram represents the linear characteristics of the parasitic E-field area 780 and the shunt nonlinear element 780-2 in the circuit diagram represents the nonlinear characteristics of the parasitic E-field area 780. Notably, the active resonator 755-1 may be modeled, for example, using a Butterworth Van Dyke, Mason, or other traditional circuit model of a resonator.

By removing a portion of the substrate 710 within the parasitic E-field area 780, and replacing it with a linear electrically insulating material or filling it with a gas, such as air, or a vacuum, according to the various embodiments described herein, the shunt nonlinear element 780-2 is substantially diminished (since the only remaining nonlinear characteristics are induced by the air-bridge 775 and the piezoelectric layer 730). The addition of the linear material (or vacuum) essentially leaves the shunt linear capacitor 780-1 connected in parallel with the active resonator 755-1 (with substantially reduced influence by shunt nonlinear element 780-2), thus significantly reducing the contribution of nonlinear currents that are generated and flow through the terminals 701 and 702 of the resulting BAW resonator. This, in turn, reduces the magnitude of unwanted nonlinear currents from being generated in the component (e.g., an acoustic filter) in which the BAW resonator is included. Also, there will be less electrical power loss (dissipation) caused by dissipative elements in the shunt nonlinear element 780-2, thus improving the quality factor of the BAW resonator.

FIG. 8 is a simplified cross-sectional view of a BAW resonator including an air-bridge as an illustrative energy confinement feature, according to a representative embodiment.

Referring to FIG. 8, BAW resonator 800 is an FBAR with an air-bridge 775, and includes substrate 710 with a cavity 815 formed in a top surface of the substrate 710. Like the BAW resonator 700, discussed above, the BAW resonator 800 further includes bottom electrode 720 is disposed over the substrate 710 and the cavity 815, piezoelectric layer 730 disposed over the bottom electrode 720, and top electrode 740 is disposed over the piezoelectric layer 730, forming an acoustic stack 850. The bottom electrode 720 includes a remote portion 720' positioned beneath a metal contact pad 770 configured to pass electrical signals. An active region 855 of the acoustic stack 850 includes overlapping portions of the cavity 715, the bottom electrode 720, the piezoelectric layer 730 and the top electrode 740, and is defined on at least one side by an inner edge of the air-bridge 775. An outer perimeter of the active region 855 is indicated by a pair of (vertical) dashed lines.

The BAW resonator 800 also includes connecting strip 740' extending from a portion of the top electrode 740 to the metal contact pad 770. The connecting strip 740' may be integrally formed with the top electrode 740, or may be a separate component connected to or otherwise in electrical contact with the top electrode 740, as discussed above with reference to the connecting strip 140' and the top electrode 140 in FIGS. 1A and 1B. The connecting strip 740' is configured to form the air-bridge 775 over an outer edge of the bottom electrode 720. In the depicted embodiment, the outer perimeter of the active region 855 adjacent the connecting strip 740' is essentially the same as the active region 755 in the BAW resonator 700 (even though the cavity 815 is larger than the cavity 715), since the outer perimeter is defined by the position of the air-bridge 775. A passivation layer (not shown) may be formed over the top electrode 740 and, in various configurations, over all or a portion of the connecting strip 740' as well. It is understood that a passivation layer may be formed over the top electrode 740 and all or a portion of the connecting strip 740' in each of the embodiments discussed herein, and therefore will not be repeated.

In the depicted embodiment, the cavity 815 includes an inner portion 816 within the active region 855 of the acoustic stack 850, and an extended portion 817 extending from an outer perimeter of the active region 855 underneath the connecting strip 740'. A length of the extended portion 817 of the cavity 815 is sufficiently long and a depth of the extended portion 817 is sufficiently deep to substantially prevent the parasitic E-field 763 from passing through the substrate 710, as show. In other words, a negligible amount of the parasitic E-field 763 passes through the substrate 710, such that a nonlinear response is improved (i.e., making the response more linear) by the substrate 710 and electrical loss generated in the substrate 710 is reduced, as discussed above.

The E-field 760 generated in the BAW resonator 800 in response to the electrical excitation provided via the connecting strip 740' is indicated by E-field lines extending from the bottom surface of the top electrode 740 to the bottom electrode 720. The parasitic E-field 763 passes through the extended portion 817 of the cavity 815, as opposed to the substrate 710, to terminate at the bottom electrode 720 (on its bottom surface). For purposes of illustration, the cavity 815 is filled with gas, such as air, which is a highly linear medium, particularly as compared to the nonlinear substrate material, such as silicon (Si). As discussed above with reference to the cavity 215, the cavity 815 (as well as cavities in the other embodiments of the BAW resonator, discussed herein) may be filled with gas other than air, such as helium, argon, nitrogen, carbon dioxide or various combinations of gases, for example, or may be a vacuum, without departing from the scope of the present teachings.

Ideally, the cavity 815 and/or the extended portion 817 is deep enough into the substrate 710, and extends far enough under the connecting strip 740', that none of the parasitic E-field 763 passes through the substrate 710, as shown in FIG. 8. This would effectively result in no nonlinear response generated in the BAW resonator 800 due to the parasitic E-field 763 in the substrate 710. This results in improved overall nonlinear response and improved electrical loss of the BAW resonator 800. As a practical matter, a small portion of the parasitic E-field 763 may pass through the substrate 710. Also, a small nonlinear response may result from portions of the parasitic E-field 763 passing through the cavity 815 or other components of the BAW resonator 800, such as the piezoelectric layer 730. However, such nonlinear responses would be minimal, and would generate little to no nonlinear current that would materially affect performance of the BAW resonator 800, or the device (e.g., acoustic filter) in which the BAW resonator 800 may be included.

FIG. 9 is a simplified cross-sectional view of a BAW resonator including an air-bridge as an illustrative energy confinement feature, according to a representative embodiment.

Referring to FIG. 9, BAW resonator 900 is an FBAR with air-bridge 775, and includes substrate 710 with a cavity 915 formed in a top surface of the substrate 710, and a trap layer 111 at upper surfaces of the substrate 710 forming the sides and bottom of the cavity 915. Although not shown in FIG. 9, in an embodiment, the trap layer 111 may also be formed at the top surface of the substrate 710 outside the cavity 915, without departing from the scope of the present teachings. Like the BAW resonator 800, the BAW resonator 900 further includes bottom electrode 720, piezoelectric layer 730 and top electrode 740 forming acoustic stack 850. The bottom electrode 720 includes remote portion 720' positioned beneath a metal contact pad 770. An active region 855 of the acoustic stack 750 includes overlapping portions of the cavity 715, the bottom electrode 720, the piezoelectric layer 730 and the top electrode 740, and is defined on at least one side by an inner edge of the air-bridge 775.

In the depicted embodiment, the cavity 915 includes an inner portion 916 within the active region 855, as mentioned above, and an extended portion 917 extending from the outer perimeter of the active region 855 underneath the connecting strip 740'. The BAW resonator 900 differs from the BAW resonator 800 in that the inner portion 916 is filled with gas (or is a vacuum) and the extended portion 917 is at least partially filled with an electrically insulating material 918 that is highly linear, such as NEBSG, doped or undoped $SiO_2$, AlN or SiC, for example, as discussed above with reference to electrically insulating materials 318, 418 and 518. Of course, other linear electrically insulating materials may be incorporated without departing from the scope of the present teachings. At a minimum, though, the electrically insulating material 918 is more linear than the substantially nonlinear material of the substrate 110.

In the depicted embodiment, the extended portion 917 is filled with the electrically insulating material 918 from the outer perimeter of the active region 855 to the outer edge of the extended portion 917. However, in other embodiments, the electrically insulating material 918 may not be filled completely to the outer perimeter of the active region 855 (leaving a larger inner portion 916). That is, the electrically insulating material 918 may end short of active region 855, but still extend beneath the connecting strip 740' to the outer edge of the cavity 915, thus creating a filled portion smaller than the extended portion 917. For example, the extended portion 917 may be filled with the electrically insulating material 918 from beneath an outer edge portion of the bottom electrode 720 below the air-bridge 775 to the outer edge of the extended portion 917. In each configuration, though, the electrically insulating material 918 provides enhanced structural support for the bottom electrode 720 (and thus the acoustic stack 850). Also, because the electrically insulating material 918 is in contact with the bottom electrode 720, it provides thermal conductivity by conducting heat away from the acoustic stack 850. This improves power handling of the BAW resonator 900 (as compared, for example, to the BAW resonator 800 which has no dielectric material in the cavity 815).

The E-field 760 generated in the BAW resonator 900 in response to the electrical excitation provided via the connecting strip 740' (and the metal contact pad 770) is indicated by E-field lines beginning at the bottom surface of the top electrode 740 and terminating at the bottom electrode 720. As shown, the parasitic E-field 763 passes through the electrically insulating material 918 (although a portion of the parasitic E-field 763 may also pass through the inner portion 916), as opposed to the substrate 710, to terminate at the bottom electrode 720. A length of the extended portion 917 of the cavity 915 is sufficiently long and a depth of the extended portion 917 is sufficiently deep to substantially prevent the parasitic E-field 763 from passing through the substrate 710, as show. In other words, a negligible amount of the parasitic E-field 763 passes through the substrate 710, such that a nonlinear response is improved by the substrate 710 (i.e., making the response more linear) and electrical loss generated in the substrate 710 is reduced, as discussed above.

Because the extended portion 917 is substantially filled with the electrically insulating material 918 as opposed to gas, for example, there would be some increase in nonlinear response of the BAW resonator 900 as compared to the BAW resonator 800. However, the nonlinear response would still be substantially less than when the E-field 763 passes primarily through the substrate 710, as shown in FIG. 7, since the incorporation of the electrically insulating material 918 would effectively eliminate or substantially reduce the portion of the parasitic E-field 763 passing through the substrate 710. This results in improved overall nonlinear response and improved electrical loss of the BAW resonator 900.

FIG. 10 is a simplified cross-sectional view of a BAW resonator including an air-bridge as an illustrative energy confinement feature, according to a representative embodiment.

Referring to FIG. 10, BAW resonator 1000 is an FBAR with air-bridge 775, and includes substrate 710 with a cavity 1015 formed in a top surface of the substrate 710, and a trap layer 111 at upper surfaces of the substrate 710 forming the sides and bottom of the cavity 1015. Like the BAW resonator 800, the BAW resonator 1000 further includes bottom electrode 720, piezoelectric layer 730 and top electrode 740 forming acoustic stack 850. The bottom electrode 720 includes remote portion 720' positioned beneath metal contact pad 770. Active region 855 of the acoustic stack 750 includes overlapping portions of the cavity 715, the bottom electrode 720, the piezoelectric layer 730 and the top electrode 740, and is defined on at least one side by an inner edge of the air-bridge 775.

In the depicted embodiment, the cavity 1015 includes an inner portion 1016 within the active region 855, as mentioned above, and extended portions 1017, 1017' extending from the outer perimeter of the active region 855 in opposite directions. The extended portion 1017 extends underneath the connecting strip 740', like the extended portion 817 discussed above with reference to FIG. 8, while the extended portion 1017' extends in a direction away from the connecting strip 740' (in the cross-sectional view), although the extended portion 1017' may also extend beyond the outer perimeter of the active region 855 other sides, as well. The cavity 1015 further includes a bottom portion 1019 along the bottom surface of the cavity 1015, providing the bottom of the inner portion 1016. The bottom portion 1019 is integral with the extended portions 1017, 1017'.

The inner portion 1016 is filled with gas (or is a vacuum), and the extended portions 1017, 1017' and the bottom portion 1019 are filled with an electrically insulating material 1018 that is highly linear, such as NEBSG, doped or undoped $SiO_2$, AlN or SiC, for example, although other linear electrically insulating materials may be incorporated without departing from the scope of the present teachings. As discussed above with regard to the electrically insulating material 918, in other embodiments, the electrically insulating material 1018 in the extended portions 1017 and/or 1017' may not be filled completely to the outer perimeter of the active region 855 (leaving a larger inner portion 1016). That is, the electrically insulating material 1018 may end short of active region 855, but still extend beneath the connecting strip 740' to the outer edge of the cavity 1015. For example, the extended portion 1017 may be filled with the electrically insulating material 1018 from beneath an outer edge portion of the bottom electrode 720 below the air-bridge 775 to the outer edge of the extended portion 1017.

The electrically insulating material 1018 has the same characteristics (e.g., more linear electrically insulating materials) and provides the same functions as the electrically insulating material 918 in FIG. 9. Such functions include providing a path for the parasitic E-field 763 beginning at the top electrode 740 and terminating at the bottom electrode 720 without passing through the substrate 710, or passes through a small portion of the substrate 710, such that a nonlinear response to the parasitic E-field by the substrate 710 is improved and electrical loss generated in the substrate 710 is reduced. Also, the electrically insulating material 1018 provides structural support for the bottom electrode 720, and a thermally conductive path from the acoustic stack 850, such that power handling of the BAW resonator 1000 is improved.

Referring to FIGS. 8, 9 and 10, it is understood that, in alternative embodiments, other energy confinement features, such as air-wings, inner frames and/or outer frames, may be included in place of or in addition to the air-bridge 775, without departing from the scope of the present teachings. These energy confinement features may affect functionality of the respective BAW resonators, as mentioned above, and may affect the size and location of corresponding active regions. Otherwise, the general impact of the extended cavities and the electrically insulating material (when present) would be substantially the same. It is further understood that the energy confinement feature(s) may be included in embodiments of a BAW resonator having an interposer layer disposed over the substrate, as discussed above with reference to FIGS. 5A and 5B, without departing from the scope of the present teachings. That is, the interposer layer is formed of an electrically insulating material that is highly linear, a cavity is formed in a top surface of the interposer layer, as opposed to in a top surface of the substrate.

Also, each of the variations of the extended cavities and/or the electrically insulating material filling may be implemented as multiple BAW resonators with a shared top electrode connection. FIG. 11 is a simplified cross-sectional view of a resonator device having two BAW resonators with a shared top electrode connection, including a common extended cavity and air-bridges as illustrative energy confinement features, according to a representative embodiment. For purposes of illustration, FIG. 11 includes a shared cavity having an extended portion filled with electrically insulating material at a connection side (beneath the connecting strip of the top electrode) of each of the BAW resonators, similar to the BAW resonator 900 in FIG. 9. However, the shared top electrode connection and shared cavity may be applied to any of the embodiments described herein.

Referring to FIG. 11, resonator device 1100 includes BAW resonators 1200 and 1300, which are FBARs with air-bridges 1275 and 1375, respectively, and substrate 1110 with a shared cavity 1115 formed in a top surface of the substrate 1110, with a trap layer 111 at upper surfaces of the substrate 1110 forming the sides and bottom of the shared cavity 1115. The resonator device 1100 further includes a bottom metal layer 1120, a shared piezoelectric layer 1130 and top metal layer 1140 stacked over the substrate 1110 and the shared cavity 1115. The shared cavity 1115 is filled in a center portion (comprising the extended portions 1217 and 1317 of the BAW resonators 1200 and 1300) with electrically insulating material 1118 that is highly linear, such as NEBSG, doped or undoped $SiO_2$, AlN or SiC, for example, as discussed above with reference to electrically insulating materials 318, 418 and 518. Of course, other linear electrically insulating materials may be incorporated without departing from the scope of the present teachings. At a minimum, though, the electrically insulating material 1118 is more linear than the substantially nonlinear material of the substrate 1110.

The BAW resonator 1200, in particular, includes an inner portion 1216 and an extended portion 1217 of the cavity 1115 formed in the top surface of the substrate 1110. The BAW resonator 1200 further includes a bottom electrode 1220 from the bottom metal layer 1120, a piezoelectric layer 1230 from the shared piezoelectric layer 1130, and a top electrode 1240 from the top metal layer 1140, together forming an acoustic stack 1250. An active region 1255 of the acoustic stack 1250 includes overlapping portions of the inner portion 1216, the bottom electrode 1220, the piezoelectric layer 1230 and the top electrode 1240, and is defined on at least one side by an inner edge of the air-bridge 1275. Similarly, the BAW resonator 1300, which is effectively a mirror image of the BAW resonator 1200, includes an inner portion 1316 and an extended portion 1317 of the cavity 1115. The BAW resonator 1300 further includes a bottom electrode 1320 from the bottom metal layer 1120, a piezoelectric layer 1330 from the shared piezoelectric layer 1130, and a top electrode 1340 from the top metal layer 1140, together forming an acoustic stack 1350. An active region 1355 of the acoustic stack 1350 includes overlapping portions of the inner portion 1316, the bottom electrode 1320, the piezoelectric layer 1330 and the top electrode 1340, and is defined on at least one side by an inner edge of the air-bridge 1375.

In the depicted embodiment, the extended portion 1217 extends from the outer perimeter of the active region 1255 underneath connecting strip 1240', and the extended portion 1317 extends in an opposite direction from the outer perimeter of the active region 1355 underneath connecting strip 1340'. As mentioned above, the extended portions 1217 and 1317 are collectively filled with the electrically insulating material 1118, and the inner portions 1216 and 1316 are filled with gas (or are vacuums). The electrically insulating material 1118 provides enhanced structural support for both the bottom electrode 1220 and the bottom electrode 1320 (and thus the acoustic stacks 1250 and 1350). Also, because the electrically insulating material 1118 is in contact with the bottom electrodes 1220 and 1320, it provides thermal conductivity by conducting heat away from the acoustic stacks 1250 and 1350, respectively. This improves power handling of the BAW resonators 1200 and 1300.

As discussed above with regard to the electrically insulating material 918, in other embodiments, the electrically insulating material 1118 in the extended portions 1217 and/or 1317 may not be filled completely to the outer perimeter of the respective active regions 1255 and 1355 (leaving larger inner portions 1216 and 1316, respectively). That is, the electrically insulating material 1118 may end short of active regions 1255 and/or 1355, but still extend beneath the connecting strips 1240' and 1340', respectively, to the outer edges of the cavity 1115. For example, the extended portion 1217 may be filled with the electrically insulating material 1118 from beneath an outer edge portion of the bottom electrode 1220 below the air-bridge 1275 to the midpoint of the cavity 115 (indicated by a vertical dashed line). Likewise, the extended portion 1317 may be filled with the electrically insulating material 1118 from beneath an outer edge portion of the bottom electrode 1120 below the air-bridge 1375 to the midpoint of the cavity 1115.

E-fields (not shown) are generated in the BAW resonators 1200 and 1300 in response to electrical excitation provided via the connecting strips 1240' and 1340', beginning at the bottom surface of the top electrodes 1240 and 1340 and terminating at the bottom electrodes 1220 and 1320, respectively. As discussed above at least with reference to FIG. 9, parasitic E-fields (not shown) from the respective E-fields pass through the electrically insulating material 1118 (although a portion of one or both of the parasitic E-fields may also pass through the inner portions 1216 and/or 1217, as opposed to the substrate 1110) to reach the bottom electrodes 1220 and 1320, such that nonlinear response by the substrate 1110 is improved and electrical loss generated in the substrate 1110 is reduced.

Figure 13:
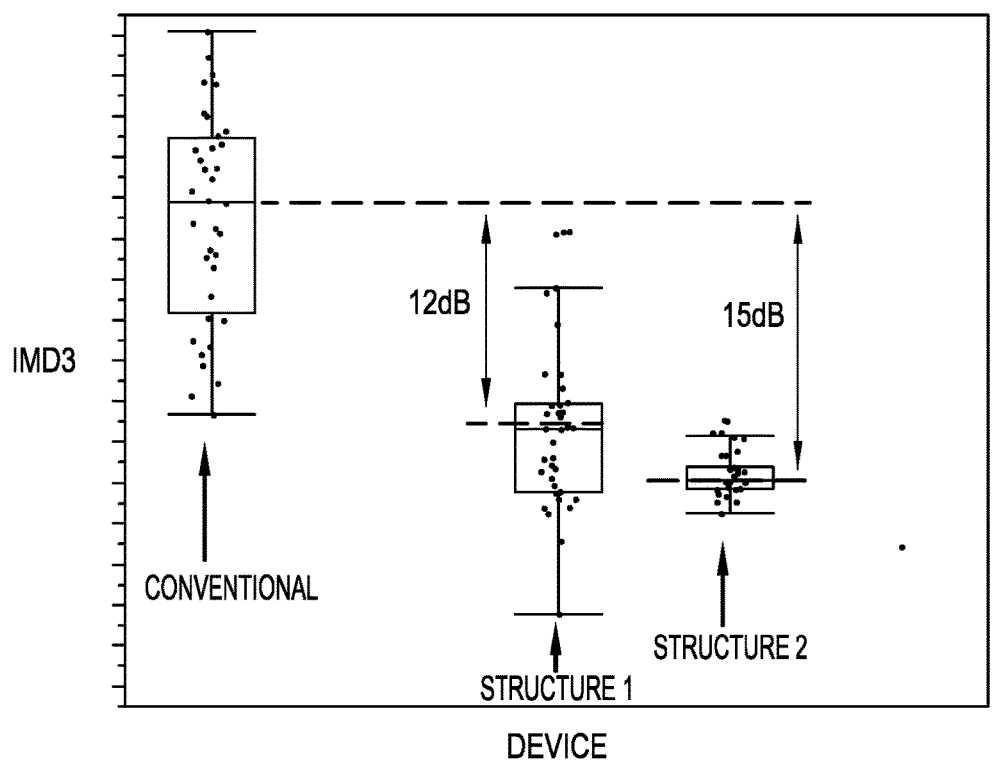
FIG. 13 is a chart showing third order intermodulation distortion (IMD3) measurement improvements of the BAW resonators, according to embodiments, over a conventional BAW resonator.
Figure 14:
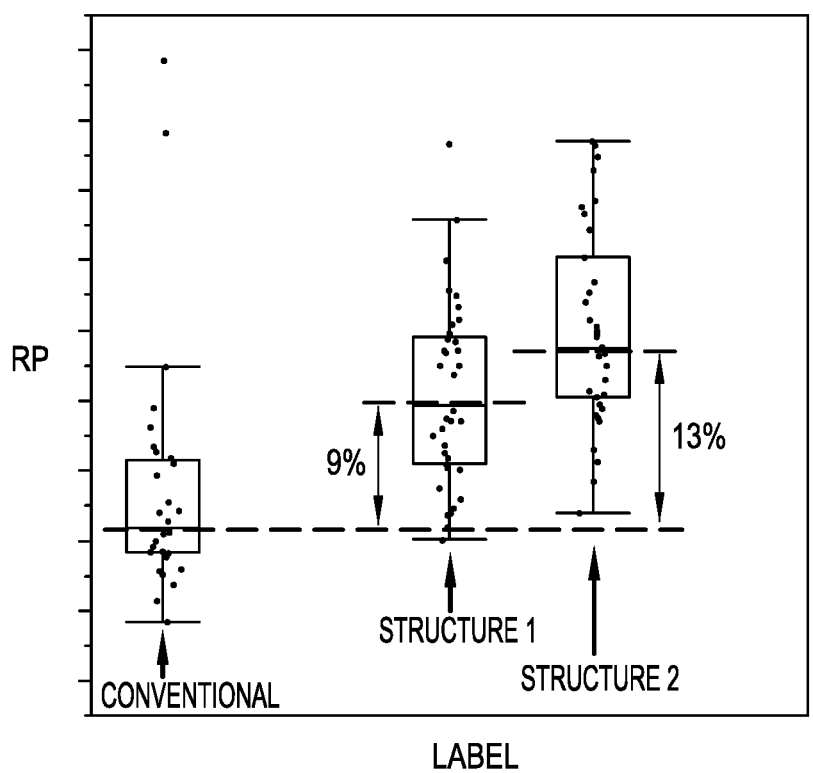
FIG. 14 is a chart showing parallel resistance (Rp) measurement improvements of the BAW resonators, according to embodiments, over a conventional BAW resonator.

FIG. 13 is a chart showing IMD3 measurement improvements of the BAW resonators, according to an embodiment, over a conventional BAW resonator, and FIG. 14 is a chart showing Rp measurement improvements of the BAW resonators, according to an embodiment, over a conventional BAW resonator.

For the measurements in both FIGS. 13 and 14, the embodiment of a BAW resonator according to FIGS. 3A and 3B was used, where "Structure 1" and "Structure 2" refer to the same embodiment, but with different dimensions. For purposes of illustration, both Structure 1 and Structure 2 have a bottom electrode 120 with a thickness of about 0.29 μm, a piezoelectric layer 130 with a thickness of about 0.60 μm, a top electrode 140 with a thickness of about 0.26 μm, and a cavity 315 with a depth of about 3.00 μm. However, in Structure 1, the connecting strip 140' extends from the outer perimeter of the active region 355 about 17.0 μm, and in Structure 2, the connecting strip 140' extends from the outer perimeter of the active region 355 about 38.0 μm. Generally, bottom electrodes may range in thickness from about 0.2 μm to about 0.5 μm, top electrodes may range in thickness from about 0.3 μm to about 0.6 μm, piezoelectric layers may range in thickness from about 1.5 μm to about 3.0 μm, and cavities may range in depth from about 2.0 μm to about 3.5 μm and in length from about 50.0 μm to about 500 μm, for example.

Referring to FIG. 13, the third order intermodulation distortion (IMD3) measurement of Structure 1 is about a 12 dB improvement, and the IMD3 measurement of Structure 2 is about a 15 dB improvement, over the IMD3 measurement of the Conventional BAW resonator. Similarly, referring to FIG. 14, the parallel resistance (Rp) measurement of Structure 1 is about a 9 percent improvement, and the Rp measurement of Structure 2 is about a 15 percent improvement, over the Rp measurement of the Conventional BAW resonator.

One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
   a substrate defining a cavity, the substrate being formed of a nonlinear material;
   an acoustic stack over the substrate and the cavity, the acoustic stack comprising:
   a bottom electrode;
   a piezoelectric layer over the bottom electrode; and
   a top electrode over the piezoelectric layer, wherein an active region of the acoustic stack comprises overlapping portions of the cavity, the bottom electrode, the piezoelectric layer and the top electrode; and
   a connecting strip extending from a portion of the top electrode for providing electrical excitation of the acoustic stack, wherein an electric field (E-field) is generated in the BAW resonator, the E-field beginning at the top electrode and terminating at the bottom electrode, in response to the electrical excitation, a portion of the E-field outside the active region of the acoustic stack being a parasitic E-field, wherein the cavity includes an inner portion in the active region of the acoustic stack and a first extended portion extending from an outer perimeter of the active region underneath the connecting strip, and wherein a length of the first extended portion of the cavity is sufficient to substantially prevent the parasitic E-field from passing through the substrate, resulting in a negligible amount of the parasitic E-field passing through the substrate, such that a nonlinear response to the parasitic E-field by the substrate is improved and electrical loss generated in the substrate is reduced.

2. The BAW resonator of claim 1, wherein the nonlinear response is improved by an amount sufficient to prevent formation of harmonics and/or intermodulation distortions (IMDs) otherwise able to disrupt performance of the BAW resonator and/or performance of a device incorporating the BAW resonator.

3. The BAW resonator of claim 1, wherein the connecting strip contacts a metal contact pad, configured to receive an electrical signal, at a contacting edge of the connecting strip, and wherein the first extended portion of the cavity extends underneath the connecting strip past the contacting edge of the connecting strip.

4. The BAW resonator of claim 1, wherein the cavity, including the first extended portion of the cavity, contains gas or is a vacuum.

5. The BAW resonator of claim 1, wherein the inner portion of the cavity contains gas or is a vacuum, and the first extended portion of the cavity contains an electrically insulating material that provides structural support for the bottom electrode, the electrically insulating material providing a more linear response to any portion of the parasitic E-field passing through the electrically insulating material and terminating at the bottom electrode than any portion of the parasitic E-field passing through the substrate and terminating at the bottom electrode.

6. The BAW resonator of claim 5, wherein the electrically insulating material has greater thermal conductivity greater than the inner portion of the cavity, such that power handling of the BAW resonator is improved.

7. The BAW resonator of claim 5, wherein the electrically insulating material provides adherence of the acoustic stack to the substrate.

8. The BAW resonator of claim 5, further comprising:
a trap layer formed at upper surfaces of the substrate, including at least surfaces of the substrate forming sides and bottom of the cavity, the electrically insulating material contained in the first extended portion of the cavity being formed over at least a portion of the trap layer.

9. The BAW resonator of claim 8, wherein the trap layer has an increased bandgap, high trap density and/or reduced carrier mobility as compared to the substrate.

10. The BAW resonator of claim 5, wherein the cavity further includes a second extended portion extending from the outer perimeter of the active region in at least one direction not underneath the connecting strip, and wherein the second extended portion of the cavity also contains the electrically insulating material.

11. The BAW resonator of claim 10, wherein the electrically insulating material has greater thermal conductivity than the inner portion of the cavity, such that power handling of the BAW resonator is improved.

12. The BAW resonator of claim 10, wherein the electrically insulating material provides adherence of the acoustic stack to the substrate.

13. The BAW resonator of claim 1, wherein the cavity further includes a second extended portion extending from the outer perimeter of the active region in at least one direction not underneath the connecting strip, and a bottom portion covering a bottom surface of the cavity, the inner portion of the cavity being surrounded by the first and second extended portions and the bottom portion, and wherein the inner portion contains gas and each of the first extended portion, the second extended portion and the bottom portion contains an electrically insulating material, the electrically insulating material contained in the first and second extended portions providing structural support for the bottom electrode, and the electrically insulating material providing a more linear response to any portion of the parasitic E-field passing through the electrically insulating material and terminating at the bottom electrode than any portion of the parasitic E-field passing through the substrate and terminating at the bottom electrode.

14. The BAW resonator of claim 13, wherein the electrically insulating material has greater thermal conductivity than the inner portion of the cavity, such that power handling of the BAW resonator is improved.

15. The BAW resonator of claim 13, wherein the electrically insulating material provides adherence of the acoustic stack to the substrate.

16. The BAW resonator of claim 1, wherein the inner portion of the cavity contains gas or is a vacuum, and a filled portion of the first extended portion of the cavity contains an electrically insulating material, the filled portion ending short of the active region and extending beneath the connecting strip to an outer edge of the first extended portion of the cavity, such that the filled portion is smaller than the first extended portion, and wherein the electrically insulating material provides a more linear response to any portion of the parasitic E-field passing through the electrically insulating material to terminate at the bottom electrode than any portion of the parasitic E-field passing through the substrate to terminate at the bottom electrode.

17. The BAW resonator of claim 16, wherein the substrate is formed of silicon, and the electrically insulating material is formed of at least one of non-etchable borosilicate glass (NEBSG), doped or undoped $SiO_2$, aluminum nitride (AlN) and Silicon Carbide (SiC).

18. An acoustic filter comprising a plurality of BAW resonators of claim 1.

19. A bulk acoustic wave (BAW) resonator, comprising:
a substrate formed of a nonlinear material;
an interposer layer over the substrate, the interposer layer being formed of a linear material and a cavity being formed in the interposer layer;
an acoustic stack over the interposer layer and the cavity, the acoustic stack comprising:
a bottom electrode;
a piezoelectric layer over the bottom electrode; and
a top electrode over the piezoelectric layer, wherein an active region of the acoustic stack comprises overlapping portions of the cavity, the bottom electrode, the piezoelectric layer and the top electrode; and
a connecting strip extending from a portion of the top electrode for providing electrical excitation of the acoustic stack, wherein an electric field (E-field) is generated in the BAW resonator, the E-field beginning at the top electrode and terminating at the bottom electrode, in response to the electrical excitation, a portion of the E-field outside the active region of the acoustic stack being a parasitic E-field, wherein a thickness of the interposer layer, between the bottom electrode and the substrate, is sufficiently large on a side of the acoustic stack from which the connecting strip extends from the top electrode to substantially prevent the parasitic E-field from passing through the substrate, resulting in a negligible amount of the parasitic E-field passing through the substrate, such that a nonlinear response to the parasitic E-field by the substrate is improved and electrical loss generated in the substrate is reduced.

20. The BAW resonator of claim 19, wherein the linear material of the interposer layer is formed of an electrically insulating material, and the cavity contains gas or is a vacuum.

21. The BAW resonator of claim 19, wherein the nonlinear response is improved by an amount sufficient to prevent formation of harmonics and/or intermodulation distortions (IMDs) otherwise able to disrupt performance of the BAW resonator and/or of a device incorporating the BAW resonator.

22. The BAW resonator of claim 19, further comprising:
a trap layer formed at a top surface of the substrate, between the interposer layer and the substrate.

23. A bulk acoustic wave (BAW) resonator, comprising:
a substrate defining a cavity, the substrate being formed of a nonlinear material; and
an acoustic stack over the substrate and the cavity, the acoustic stack comprising:
a bottom electrode layer;
a piezoelectric layer over the bottom electrode layer; and
a top electrode layer over the piezoelectric layer, wherein an active region of the acoustic stack comprises overlapping portions of the cavity, the bottom electrode layer, the piezoelectric layer and the top electrode layer, and the top electrode layer includes a connecting strip extending from at least a portion of the top electrode layer in the active region, the connecting strip providing electrical excitation of the acoustic stack, wherein an electric field (E-field) is generated in the BAW resonator in response to the electrical excitation,
wherein the cavity includes a first extended portion extending from an outer perimeter of the active region underneath the connecting strip, the first extended portion having a length substantially preventing any portion of the E-field outside the active region of the acoustic stack from passing through the substrate, such that a nonlinear response to the E-field by the substrate is improved and electrical loss generated in the substrate is reduced.

24. The BAW resonator of claim 23, wherein the cavity, including the first extended portion of the cavity, contains gas or is a vacuum.

25. The BAW resonator of claim 23, wherein the cavity further includes an inner portion in the active region of the acoustic stack, and
wherein the inner portion of the cavity contains gas and the first extended portion of the cavity contains an electrically insulating material that provides structural support for the bottom electrode layer, the electrically insulating material providing a more linear response to any portion of the E-field in the electrically insulating material than the substrate would provide, the electrically insulating material has greater thermal conductivity than the inner portion of the cavity, such that power handling of the BAW resonator is improved.

26. The BAW resonator of claim 25, wherein the cavity further includes a second extended portion extending from the outer perimeter of the active region in at least one direction not underneath the connecting strip, and
wherein the second extended portion of the cavity also contains the electrically insulating material.

27. The BAW resonator of claim 23, wherein the top electrode layer defines an energy confinement feature.

28. The BAW resonator of claim 27, wherein the energy confinement feature comprises an air-bridge, and the active region is further defined is defined on at least one side by an inner edge of the air-bridge.

29. The BAW resonator of claim 23, wherein the cavity further includes a second extended portion extending from the outer perimeter of the active region in at least one direction not underneath the connecting strip, and a bottom portion covering a bottom surface of the cavity, an inner portion of the cavity being surrounded by the first and second extended portions and the bottom portion, and
wherein the inner portion contains gas and each of the first extended portion, the second extended portion and the bottom portion of the cavity contains an electrically insulating material, the electrically insulating material contained in the first and second extended portions providing structural support for the bottom electrode layer, and the electrically insulating material providing a more linear response to any portion of the E-field passing through the electrically insulating material than the substrate would provide.

30. A bulk acoustic wave (BAW) resonator device including a plurality of BAW resonators with a shared top electrode connection, the BAW resonator device comprising:
a substrate defining a cavity, the substrate being formed of a nonlinear material; and
a plurality of acoustic stacks over the substrate and the cavity, the plurality of acoustic stacks comprising:
a plurality of bottom electrodes corresponding to the plurality of acoustic stacks;
a piezoelectric layer over the plurality of bottom electrodes; and
a top electrode layer over the piezoelectric layer, wherein active regions of the acoustic stacks comprise overlapping portions of the cavity, the bottom electrodes, the piezoelectric layer and the top electrode layer, respectively, and the top electrode layer includes a plurality of connecting strips extending from at least a portion of the top electrode layer in the active regions, the connecting strips providing corresponding electrical excitations of the acoustic stacks, respectively, wherein electric fields (E-fields) are generated in the BAW resonators in response to the corresponding electrical excitations,
wherein the E-fields begin at the top electrode layer and terminate at a corresponding one of the bottom electrodes in response to the electrical excitations, respectively, portions of the E-fields outside the active regions of the acoustic stacks being parasitic E-fields,
wherein the cavity includes inner portions in the active regions of the acoustic stacks, respectively, and a shared extended portion between outer perimeters of the active regions underneath the connecting strips, the shared extended portion containing an electrically insulating material, the electrically insulating material providing a more linear response to any portions of the parasitic E-fields passing through the electrically insulating material than any portions of the parasitic E-fields passing through the substrate, and wherein a length of the shared extended portion of the cavity is sufficient to substantially prevent the parasitic E-fields from passing through the substrate.

* * * * *